US012633905B2

(12) United States Patent
Goyal et al.

(10) Patent No.: US 12,633,905 B2
(45) Date of Patent: May 19, 2026

(54) LOW POWER MULTIBIT FLIP-FLOP FOR STANDARD CELL LIBRARY

(71) Applicant: SAMSUNG ELECTRONICS CO., LTD., Suwon-si (KR)

(72) Inventors: Mitesh Goyal, Bengaluru (IN); Hareharan Nagarajan, Bengaluru (IN); Abhishek Ghosh, Bengaluru (IN); Chiranshu Banthia, Bengaluru (IN)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 417 days.

(21) Appl. No.: 18/202,671

(22) Filed: May 26, 2023

(65) Prior Publication Data

US 2024/0339992 A1 Oct. 10, 2024

(30) Foreign Application Priority Data

Apr. 5, 2023 (IN) .............................. 202341025819

(51) Int. Cl.
*H03K 3/3562* (2006.01)
*G01R 31/3185* (2006.01)
*H03K 3/012* (2006.01)

(52) U.S. Cl.
CPC . *H03K 3/35625* (2013.01); *G01R 31/318544* (2013.01); *G01R 31/318594* (2013.01); *H03K 3/012* (2013.01)

(58) Field of Classification Search
CPC .... G01R 31/318544; G01R 31/318594; H03K 3/012; H03K 3/35625

USPC ................................................... 327/202, 203
See application file for complete search history.

(56) References Cited

U.S. PATENT DOCUMENTS

| | | | |
|---|---|---|---|
| 8,578,224 B2 | 11/2013 | Gurumurthy et al. | |
| 9,361,417 B2 | 6/2016 | Arunachalam et al. | |
| 9,425,771 B2 | 8/2016 | Nandi et al. | |
| 9,473,117 B2 | 10/2016 | Kim et al. | |
| 9,490,783 B1 | 11/2016 | Hill | |
| 9,537,471 B2 | 1/2017 | Kamal | |
| 9,729,128 B2 | 8/2017 | Srivastava et al. | |
| 9,755,623 B2 | 9/2017 | Cheng et al. | |
| 10,270,433 B1 * | 4/2019 | Venugopal ........... | H03K 3/3568 |
| 10,659,017 B1 | 5/2020 | Rengarajan et al. | |
| 10,958,252 B2 | 3/2021 | Wu et al. | |
| 11,025,236 B1 | 6/2021 | Lai et al. | |
| 11,366,161 B2 | 6/2022 | Roy et al. | |
| 2007/0001729 A1 * | 1/2007 | Branch .............. | H03K 3/35625 327/202 |

(Continued)

*Primary Examiner* — William Hernandez
(74) *Attorney, Agent, or Firm* — Sughrue Mion, PLLC

(57) ABSTRACT

A multibit flip flop is provided. The multibit flip flop includes: a first stage one-bit flip flop; and a second stage one-bit flip flop, wherein the first stage one-bit flip flop and the second stage one-bit flip flop are configured to share a common clock signal. The first stage one-bit flip flop and the second stage one-bit flip flop are configured to use an inter cell scan input transfer function in a sequential manner. The first stage one-bit flip flop is further configured to provide a scan output signal based on a scan input signal provided at an input port of the first stage one-bit flip flop. The second stage one-bit flip flop is further configured to provide a scan final output signal based on the scan output signal that is provided at an input port of the second stage one-bit flip flop.

20 Claims, 21 Drawing Sheets

(56)            References Cited

U.S. PATENT DOCUMENTS

| | | | |
|---|---|---|---|
| 2012/0146697 A1 | 6/2012 | Leach et al. | |
| 2015/0318845 A1* | 11/2015 | Pasternak | H03K 3/35625 |
| | | | 716/102 |
| 2017/0292993 A1 | 10/2017 | Yoon et al. | |
| 2021/0099161 A1* | 4/2021 | Rasouli | H03K 3/35625 |
| 2022/0173725 A1 | 6/2022 | Bhat et al. | |
| 2025/0199070 A1* | 6/2025 | Gayakwad | G01R 31/31726 |
| 2025/0247082 A1* | 7/2025 | Khawas | H03K 3/35625 |

* cited by examiner

SDFFRPQ_1

SDFFRPQ_2

SDFFSNQ_2

2BIT_SDFFQ_TOP

2BIT_SDFFRPQ_TOP

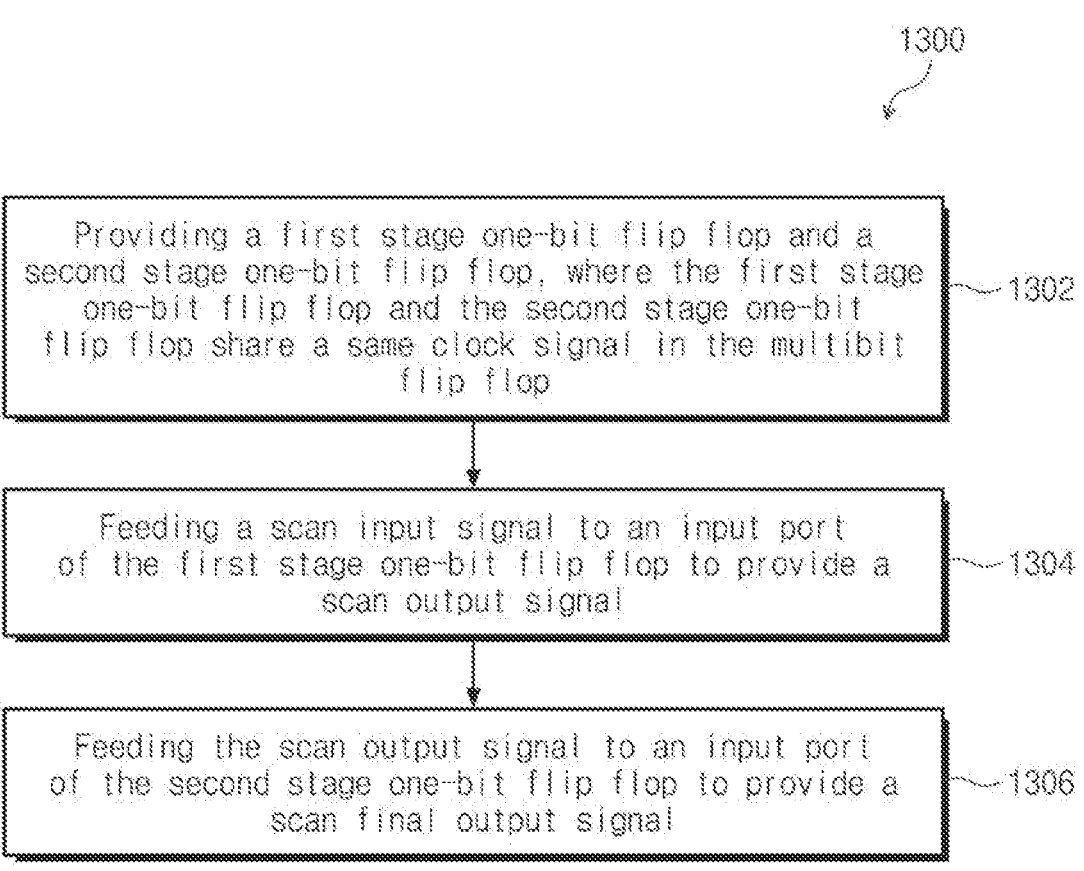

1300

Providing a first stage one-bit flip flop and a second stage one-bit flip flop, where the first stage one-bit flip flop and the second stage one-bit flip flop share a same clock signal in the multibit flip flop ~1302

Feeding a scan input signal to an input port of the first stage one-bit flip flop to provide a scan output signal ~1304

Feeding the scan output signal to an input port of the second stage one-bit flip flop to provide a scan final output signal ~1306

Figure 14:
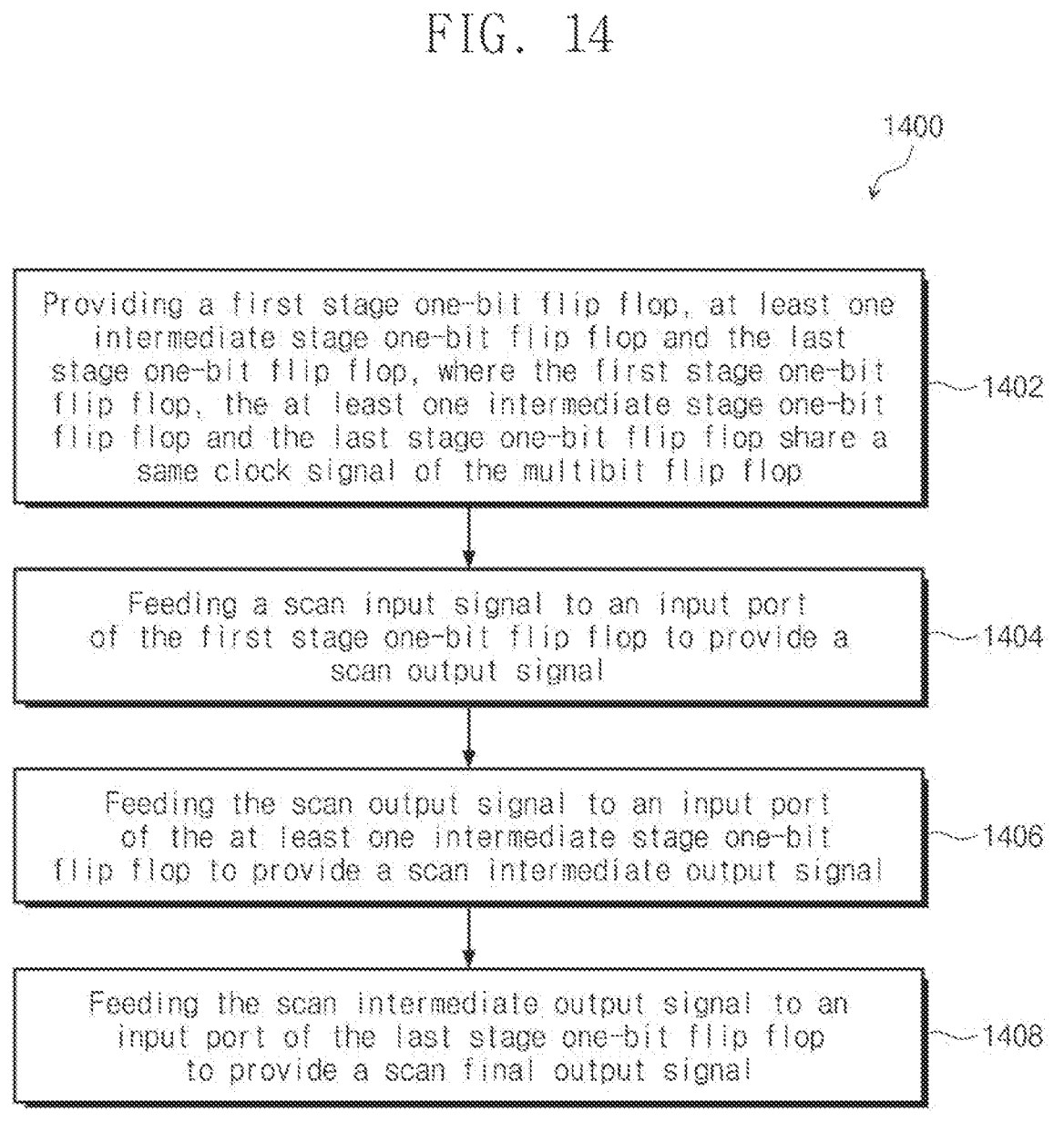

Providing a first stage one-bit flip flop, at least one intermediate stage one-bit flip flop and the last stage one-bit flip flop, where the first stage one-bit flip flop, the at least one intermediate stage one-bit flip flop and the last stage one-bit flip flop share a same clock signal of the multibit flip flop ~1402

Feeding a scan input signal to an input port of the first stage one-bit flip flop to provide a scan output signal ~1404

Feeding the scan output signal to an input port of the at least one intermediate stage one-bit flip flop to provide a scan intermediate output signal ~1406

Feeding the scan intermediate output signal to an input port of the last stage one-bit flip flop to provide a scan final output signal ~1408

LOW POWER MULTIBIT FLIP-FLOP FOR STANDARD CELL LIBRARY

CROSS-REFERENCE TO RELATED APPLICATION

This application claims priority from Indian patent application Ser. No. 202341025819, filed on Apr. 5, 2023, in the Office of the Controller General of patents, Designs and Trade Marks, the disclosure of which is incorporated herein by reference in its entirety.

BACKGROUND

1. Field

The present disclosure relates to a field of a semiconductor device, and more particularly related to a semiconductor cell architecture such as multibit flip flop for a standard cell library.

2. Description of Related Art

There is continuous demand for a system on chip (SoC) with reduced power consumption and reduced size. Clock power consumption is a problem in synchronous SoC design. Multibit library kit is a low power solution that may be used in clock tree based designs to reduce an internal power consumption of sequential cells and to optimize a clock load of flip flop circuits. Clock inverter sharing may assist in reducing a capacitance of the flip flop circuits. A scan chain may be connected inside the sequential cells to optimize a hold buffer insertion in a scan chain path of the flip flop circuits. However, the related methods and techniques do not provide a low power multibit flip flop that is operable using an ultra-low power flip flop bit, how to create an asynchronous reset/set version in the low power multibit flip flop using the ultra-low power flip flop bit, and how to connect the scan chain within the multibit solution in a manner that efficiently uses power and in a compact area.

SUMMARY

One or more example embodiments relate to design and configuration of a multibit flip flop for a standard cell library.

One or more example embodiments relate to a circuit based on a highly optimized low power bit-cells with an internal scan chain stitching and a true single phase clock design, without any penalty for scan chain connection. The multi-bit circuits provide improved power gain and area savings for a 2 bit cell. The proposed circuit may use cross couple transmission gate based topology of flip flops, without any compromise on the performance. The circuit topology may be extended across any bit length and is technology node independent.

One or more example embodiments also provide a true single phase clock circuit having a shared clock net among the flip flops (without using a clock buffer or an inverter leading to no shared transistors between the individual flip flops) where the shared clock net provides improved power optimization.

One or more example embodiments provide a set of transistors specifically arranged to form a sequential logic circuit with a reduced transistor count, and provide asynchronous set/reset on output pins.

According to an example embodiment, a multibit flip flop includes: a first stage one-bit flip flop; and a second stage one-bit flip flop, wherein the first stage one-bit flip flop and the second stage one-bit flip flop are configured to share a common clock signal. The first stage one-bit flip flop and the second stage one-bit flip flop are configured to use an inter cell scan input transfer function in a sequential manner, the first stage one-bit flip flop is further configured to provide a scan output signal based on a scan input signal provided at an input port of the first stage one-bit flip flop, and the second stage one-bit flip flop is further configured to provide a scan final output signal based on the scan output signal that is provided at an input port of the second stage one-bit flip flop.

According to an example embodiment, a multibit flip flop includes: a first stage one-bit flip flop; at least one intermediate stage one-bit flip flop; and a last stage one-bit flip flop, wherein the first stage one-bit flip flop, the at least one intermediate stage one-bit flip flop and the last stage one-bit flip flop are configured to share a common clock signal. The first stage one-bit flip flop, the at least one intermediate stage one-bit flip flop and the last stage one-bit flip flop are configured to use an inter cell scan input transfer function in a sequential manner, the first stage one-bit flip flop is configured to provide a scan output signal based on a scan input signal provided at an input port of the first stage one-bit flip flop, the at least one intermediate stage one-bit flip flop is configured to provide a scan intermediate output signal based on the scan output signal, and the last stage one-bit flip flop is configured to provide a scan final output signal based on the scan intermediate output signal.

According to an example embodiment, a method of a multibit flip flop includes: providing a first stage one-bit flip flop and a second stage one-bit flip flop, wherein the first stage one-bit flip flop and the second stage one-bit flip flop share a common clock signal, and wherein the first stage one-bit flip flop and the second stage one-bit flip flop use an inter cell scan input transfer function in a sequential manner; generating a scan output signal based on a scan input signal provided to an input port of the first stage one-bit flip flop; and generating a scan final output signal based on the scan output signal.

According to an example embodiment, a method of a multibit flip flop includes: providing a first stage one-bit flip flop, at least one intermediate stage one-bit flip flop and a last stage one-bit flip flop, wherein the first stage one-bit flip flop, the at least one intermediate stage one-bit flip flop and the last stage one-bit flip flop share a common clock signal, and wherein the first stage one-bit flip flop, the at least one intermediate stage one-bit flip flop and the last stage one-bit flip flop use an inter cell scan input transfer function in a sequential manner; generating a scan output signal based on a scan input signal provided to an input port of the first stage one-bit flip flop; generating a scan intermediate output signal based on the scan output signal; and generating a scan final output signal based on the scan intermediate output signal.

BRIEF DESCRIPTION OF DRAWINGS

The above and other aspects, features and advantages will be apparent from the following description, taken in conjunction with the accompanying drawings, in which:

FIG. 8 is a circuit diagram of a 2 bit Scannable D-Flipflop with an asynchronous reset pin and a Q pin that follows the same level as a D input signal (2BIT_SDFFRPQ_TOP) and has common clock pin, according to an example embodiment;

FIG. 10 is a circuit diagram of a 3 bit scannable D-flipflop with a Q pin that follows the same level as a D input pin (3BIT_SDFFQ_TOP) and has have a common clock pin, according to an example embodiment;

FIGS. 12A and 12B are circuit diagrams of a 4 bit Scannable D-Flipflop with an asynchronous set pin and a Q pin that follows the same level of a D input signal (4BIT_SDFFSNQ_TOP), and clamps the Q output to a high level when the set pin is asserted, according to an example embodiment;

FIG. 13 is a flow chart illustrating a method for configuring a multibit flip flop, according to an example embodiment; and FIG. 14 is a flow chart illustrating a method for configuring a multibit flip flop, according to an example embodiment.

DETAILED DESCRIPTION

Figure 1A:
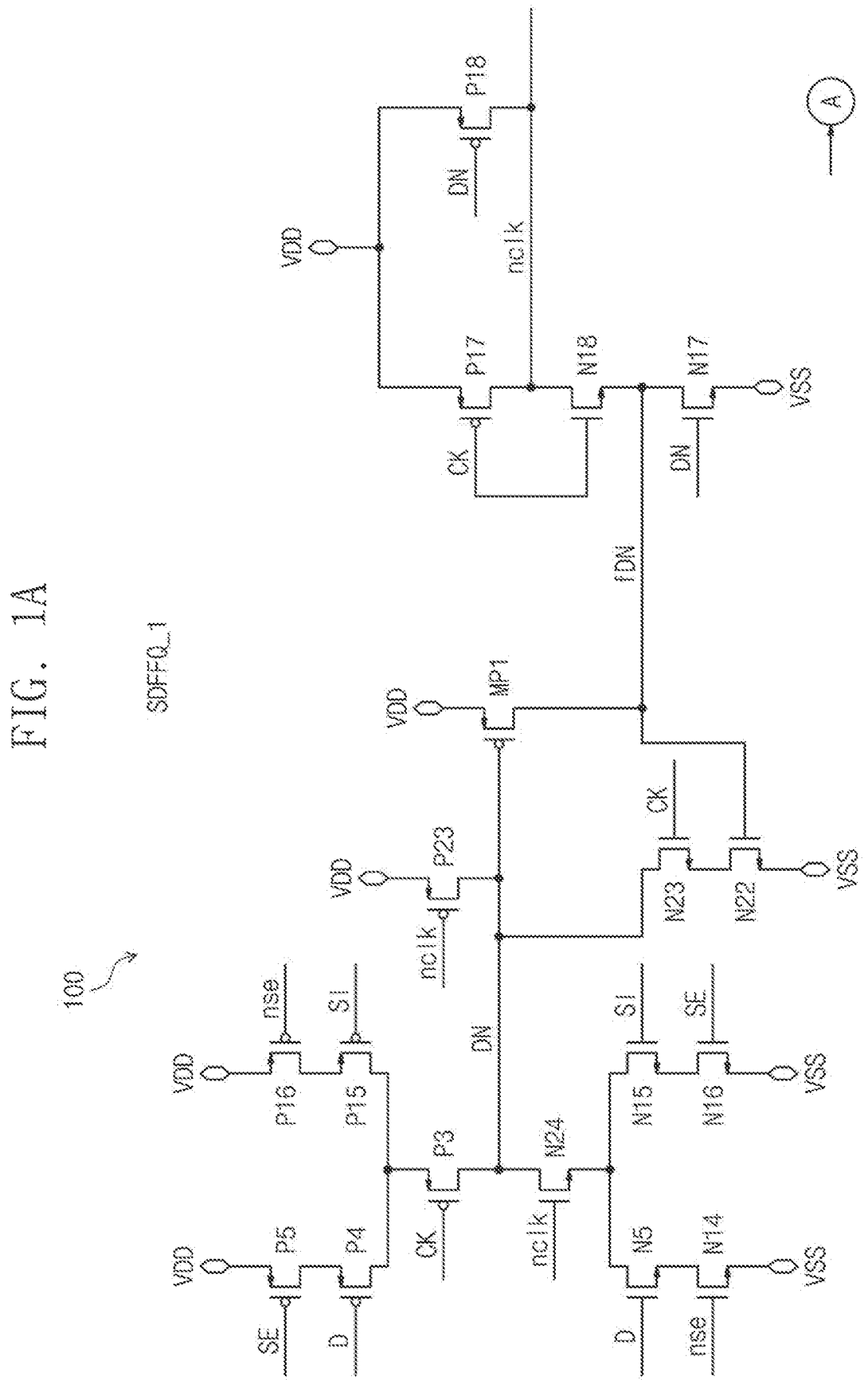
FIG. 1A and FIG. 1B are circuit diagrams of a Scannable D-Flip flop with a Q pin that follows the same level of a D input signal (SDFFQ_1), according to an example embodiment.

Hereinafter, example embodiments will be described in detail with reference to the accompanying drawings.

The embodiments described herein are example embodiments, and thus, the present disclosure is not limited thereto, and may be realized in various other forms. Each of the example embodiments provided in the following description is not excluded from being associated with one or more features of another example or another example embodiment also provided herein or not provided herein but consistent with the present disclosure. For example, even if matters described in a specific example or example embodiment are not described in a different example or example embodiment thereto, the matters may be understood as being related to or combined with the different example or example embodiment, unless otherwise mentioned in descriptions thereof. In addition, it should be understood that all descriptions of principles, aspects, examples, and example embodiments of the present disclosure are intended to encompass structural and functional equivalents thereof. In addition, these equivalents should be understood as including not only currently well-known equivalents, but also equivalents to be developed in the future, that is, all devices performing the same functions regardless of the structures thereof.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c. Herein, when a term "same" is used to compare a dimension of two or more elements, the term may cover a "substantially same" dimension.

It will be understood that, although the terms first, second, third, fourth etc. may be used herein to describe various elements, these elements should not be limited by these terms. These terms are only used to distinguish one element from another element. Thus, a first element discussed below could be termed a second element without departing from the teachings of the present disclosure.

It will be also understood that, even if a certain step or operation is described later than another step or operation, the step or operation may be performed later than the other step or operation unless the other step or operation is specifically described as being performed after the step or operation.

Example embodiments provide a multibit flip flop for a standard cell library. The multibit flip flop includes a first stage one-bit flip flop and a second stage one-bit flip flop, where the first stage one-bit flip flop and the second stage one-bit flip flop share a same clock signal (CK). The first stage one-bit flip flop and the second stage one-bit flip flop use an inter cell scan input transfer function in a sequential manner. A scan input signal is provided to an input port of the first stage one-bit flip flop, which provides a scan output signal to an input port of the second stage one-bit flip flop to provide a scan final output signal.

The multibit flip flop may be used for a standard cell library. Circuits according to example embodiments are based on highly optimized low power bit-cells with an internal scan chain stitching and a true single phase clock design, without any penalty for scan chain connection. The multi-bit circuits offer betters power gain and area savings for a 2-bit cell. Circuits according to example embodiments may use cross couple transmission gate based topology of flip flops, without any compromise on the performance. The circuit topology may be extended across any bit length and is technology node independent. In circuits according to example embodiments, a true single phase clock circuit includes a shared clock net among the flip flops (without using a clock buffer or an inverter leading to no shared transistors between the individual flip flops) where the shared clock net helps in power optimization while drawing layouts.

Example embodiments provide transistors arranged to form a sequential logic circuit, which reduces a transistor count) to achieve the asynchronous set/reset on the output pins. The circuit topology may be extended across any bit length and is technology node independent. Example embodiments are applicable to all commonly used multibit flipflop topologies, including basic non-scannable, scannable, asynchronous reset, asynchronous set, etc.

In the proposed circuit, the multibit with scan chain internal connection are superior in DFT inserted designs. Multibit based on highly optimized topology which is appropriate for scan chain internal connection. Scan chain built-in the multibit flipflops help in hold buffer reduction at block level post DFT. It hence saves power in a fully routed, hold fixed, DFT inserted designs and in non-scan mode. Sharing of Scan enable inverter from flip-flop design helps us in reducing the overall cell internal power. Also common transistors on asynchronous pins are shared across the bits. Scan out pin chosen in circuit, so that it minimally impacts D2Q timing PPA. The common clock net cap is optimized at layout level and cell area can be saved (vs single bit flops). The proposed circuit can be easily scaled around many bits, without any upsizing of clock inverters.

Figure 1B:
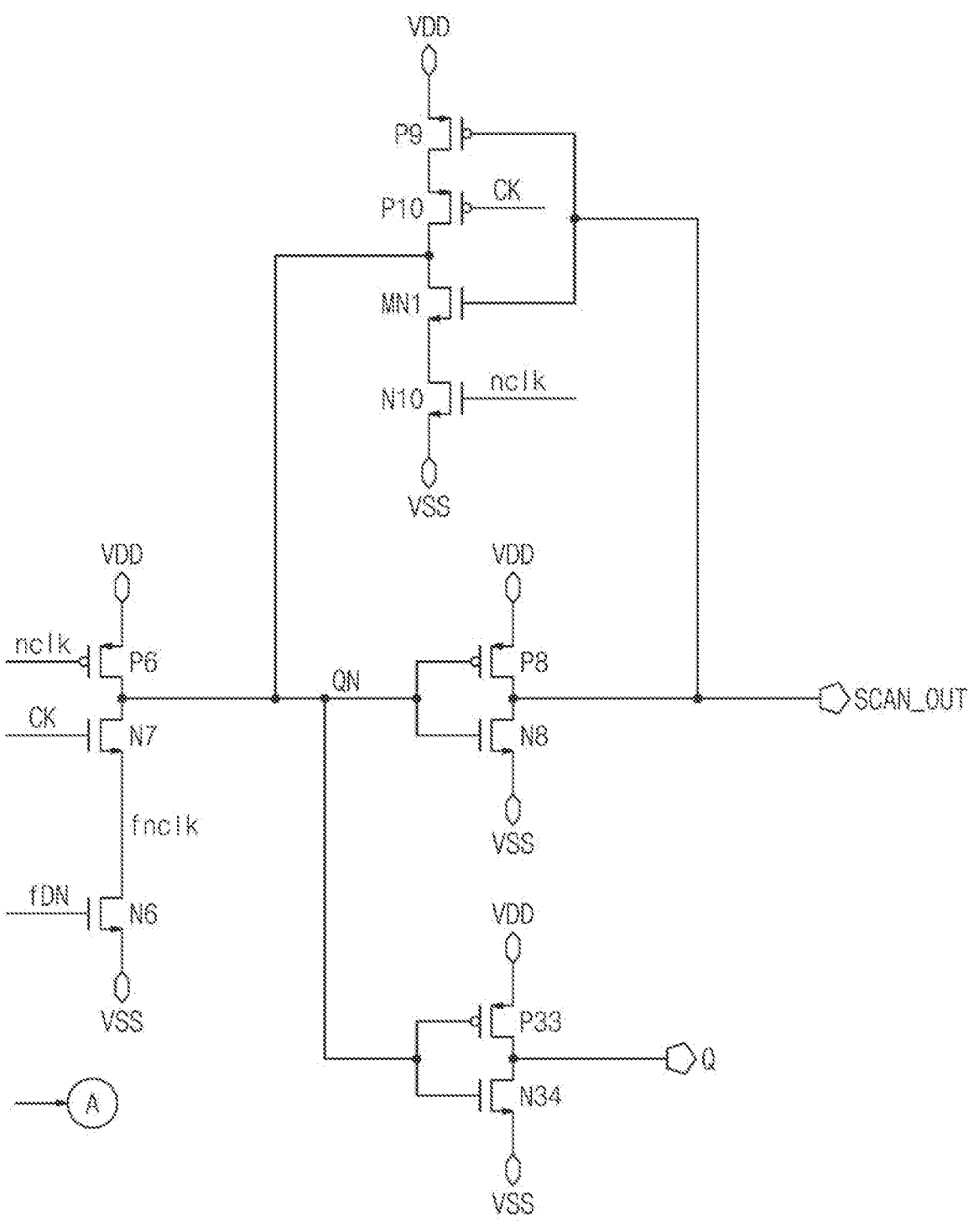

FIG. 1A and FIG. 1B are circuit diagrams of a Scannable D-Flip flop SDFFQ_1, according to an example embodiment. The Scannable D-Flip flop includes a Q pin that follows the same level of a D input signal. In an example embodiment, the SDFFQ_1 includes a multiplexer having a pull-up circuit and a pull-down circuit, a first clock gate circuit, a master latch, a clock signal generation circuit, a second clock gate, a slave latch and an output stage. The pull-up circuit includes a p-channel metal-oxide semiconductor (PMOS) transistor (P16), a PMOS transistor (P15), a PMOS transistor (P4) and a PMOS transistor (P5). The pull-down circuit includes a n-channel metal-oxide semiconductor (NMOS) transistor (N5), a NMOS transistor (N14), a NMOS transistor (N15), and a NMOS transistor (N16). An output of the pull-up circuit may be provided to the master latch based on an input of the scan enable pin (SE) of the pull-up circuit.

The first clock gate circuit includes a NMOS transistor (N24) and a PMOS transistor (P3). The NMOS transistor (N24) and the PMOS transistor (P3) allow an inverted input signal (D or SI) to be provided to a latch memory at a low state of the clock signal. The latch memory may include the master latch, and the master latch may include a forward path and a reverse path. A multiplexed signal from the multiplexer is propagated to the master latch based on a clock state controlled by the NMOS transistor (N24) and the PMOS transistor (P3). The latch memory may include a hybrid master latch, which includes the master latch and the clock signal generation circuit. The forward path of the master latch includes a PMOS transistor (MP1) and a NMOS transistor (N17). The reverse path of the master latch includes a PMOS transistor (P23) and NMOS transistors (N22 and N23). An output signal of the master latch is a signal (fDN), which is propagated based on a state of the second clock gate circuit. A nclk signal is generated at the clock signal generation circuit, where the clock signal generation circuit includes PMOS transistors (P17 and P18) and NMOS transistors (N17 and N18).

The second clock gate includes a pull-up circuit having a PMOS transistor (P6) and a pull-down circuit having NMOS transistors (N6 and N7). The signal (fDN) is propagated to a slave latch of the second clock gate and to an output inverter of the output stage depending on a state of CK signal and the nclk signal. The slave latch may include a forward path and a reverse path. The slave latch stores a signal when a clock (CK) state is at a high level (i.e., one) and keeps an output signal (Q) from going to a high impedance state when CK state is at a low level (i.e., zero) for a rising clock edge triggered flip flop.

The output stage receives a scan-out signal output (SCAN_OUT) from the forward path of the slave latch. The forward path includes a PMOS transistor (P8) and a NMOS transistor (N8), where a scan-out signal output of a CMOS inverter formed by the PMOS transistor (P8) and the NMOS transistor (N8) have the same polarity as an output pin (Q0). The reverse path of the slave latch includes PMOS transistors (P9 and P10) and NMOS transistors (MN1 and N10). The output stage includes a PMOS transistor (P33) and a NMOS transistor (N34), wherein a signal of the output stage is stored by the slave latch.

Figure 2A:
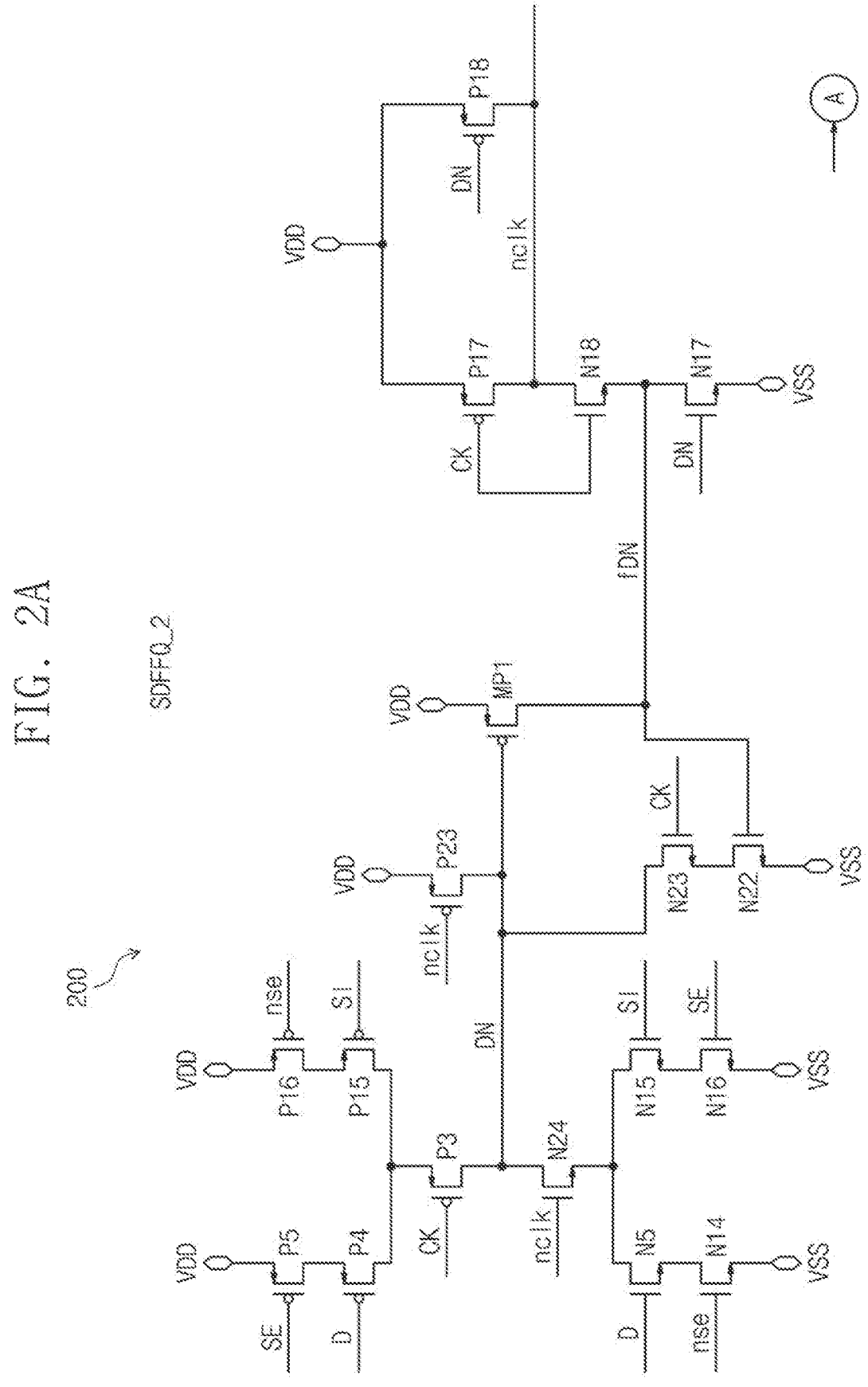
FIG. 2A and FIG. 2B are circuit diagrams of a SDFFQ_2, according to an example embodiment as disclosed herein.
Figure 2B:
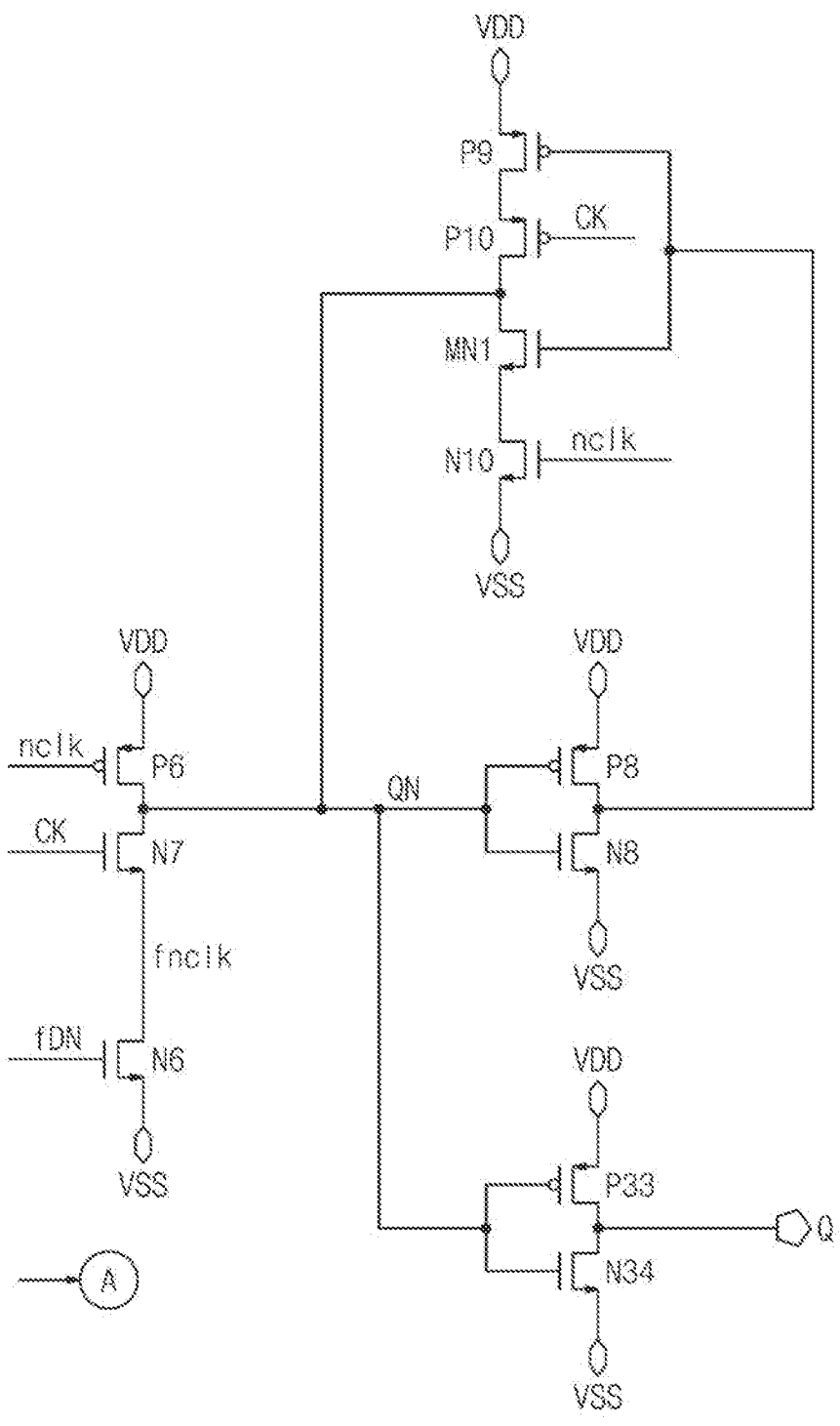

FIG. 2A and FIG. 2B are circuit diagrams (200) of a Scannable D-Flip flop SDFFQ_2, according to an example embodiment. The SDFFQ_2 includes a multiplexer including a pull-up circuit and a pull-down circuit, a first clock gate circuit, a master latch, a clock signal generation circuit, a second clock gate, a slave latch and an output stage. The pull-up circuit includes a PMOS transistor (P16), a PMOS transistor (P15), a PMOS transistor (P4) and a PMOS transistor (P5). The pull-down circuit includes a n-channel metal-oxide semiconductor (NMOS) transistor (N5), a NMOS transistor (N14), a NMOS transistor (N15), and a NMOS transistor (N16). An output of the pull-up circuit may be provided to the master latch based on an input of the scan enable pin (SE) of the pull-up circuit.

The first clock gate circuit includes a NMOS transistor (N24) and a PMOS transistor (P3). The NMOS transistor (N24) and the PMOS transistor (P3) allow an inverted input signal (D or SI) to be provided to a latch memory at a low state of the clock signal. The latch memory may include the master latch, and the master latch may include a forward path and a reverse path. A multiplexed signal from the multiplexer is propagated to the master latch based on a clock state controlled by the NMOS transistor (N24) and the PMOS transistor (P3).

The latch memory may include a hybrid master latch, which includes the master latch and the clock signal generation circuit. The forward path of the master latch includes a PMOS transistor (MP1) and a NMOS transistor (N17). The reverse path of the master latch includes a PMOS transistor (P23) and NMOS transistors (N22 and N23). An output signal of the master latch is a signal (fDN), which is propagated based on a state of the second clock gate circuit. A nclk signal is generated at the clock signal generation circuit, where the clock signal generation circuit includes PMOS transistors (P17 and P18) and NMOS transistors (N17 and N18).

The second clock gate includes a pull-up circuit having a PMOS transistor (P6) and a pull-down circuit having NMOS transistors (N6 and N7), where the signal (fDN) is propagated to a slave latch of the second clock gate and to an output inverter of the output stage depending on a state of CK signal and the nclk signal. The slave latch may include a forward path and a reverse path. The slave latch stores a signal when a clock (CK) state is at a high level (i.e., one) and keeps the output signal (Q) from going to a high impedance state when CK state is at a low level (i.e., zero) for a rising clock edge triggered flip flop.

A CMOS inverter may be formed by the PMOS transistor (P8) and the NMOS transistor (N8). A scan-out signal output by the CMOS inverter has the same polarity as output pin (Q0). The reverse path of the slave latch includes PMOS transistors (P9 and P10) and NMOS transistors (MN1 and N10). The output stage includes a PMOS transistor (P33) and a NMOS transistor (N34), wherein a signal of the output stage is stored by the slave latch.

Figure 3A:
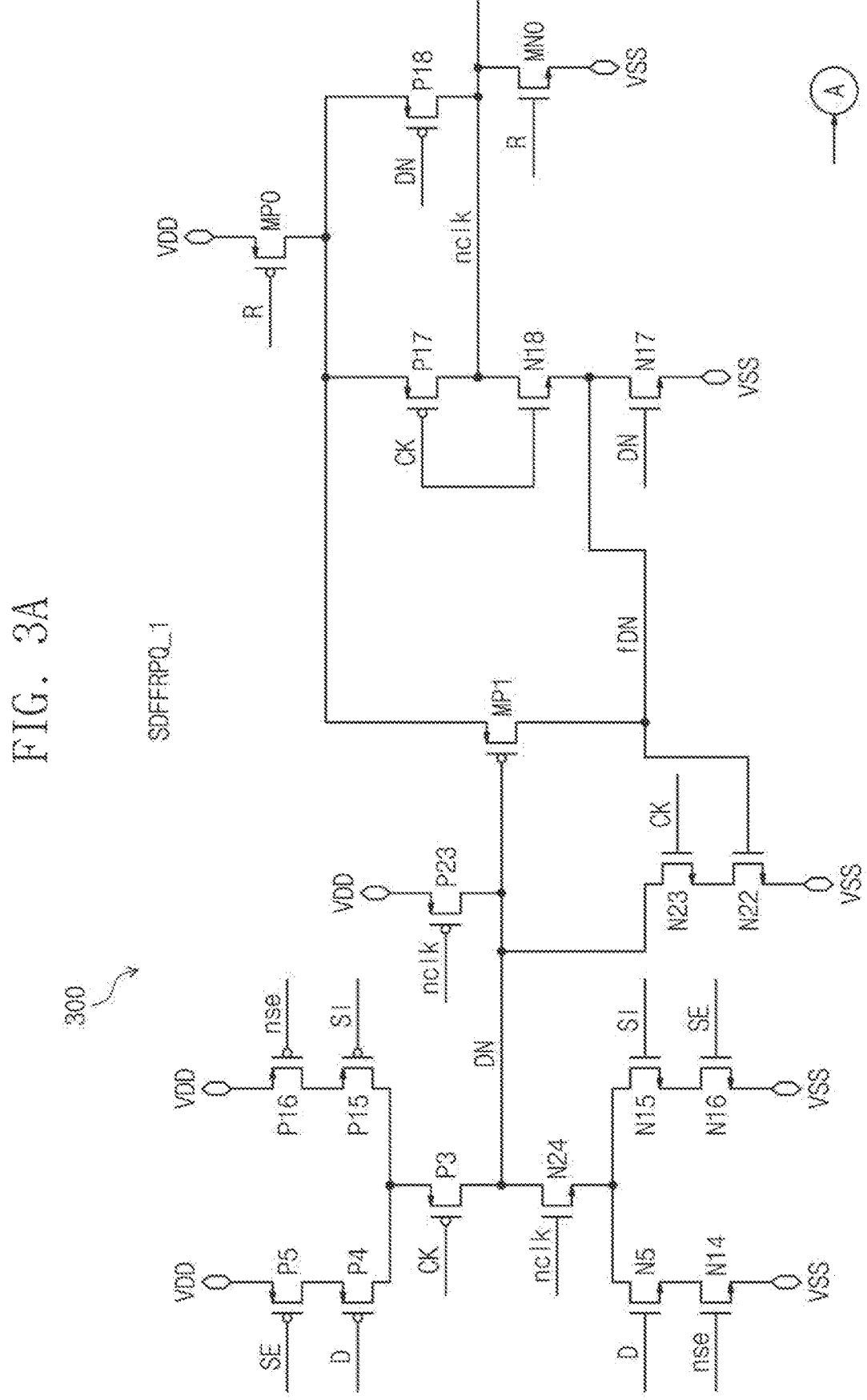
FIG. 3A and FIG. 3B are circuit diagrams of a Scannable D-Flipflop with an asynchronous reset pin and a Q pin that follows the same level as D input signal (SDFFRPQ_1), according to an example embodiment.
Figure 3B:
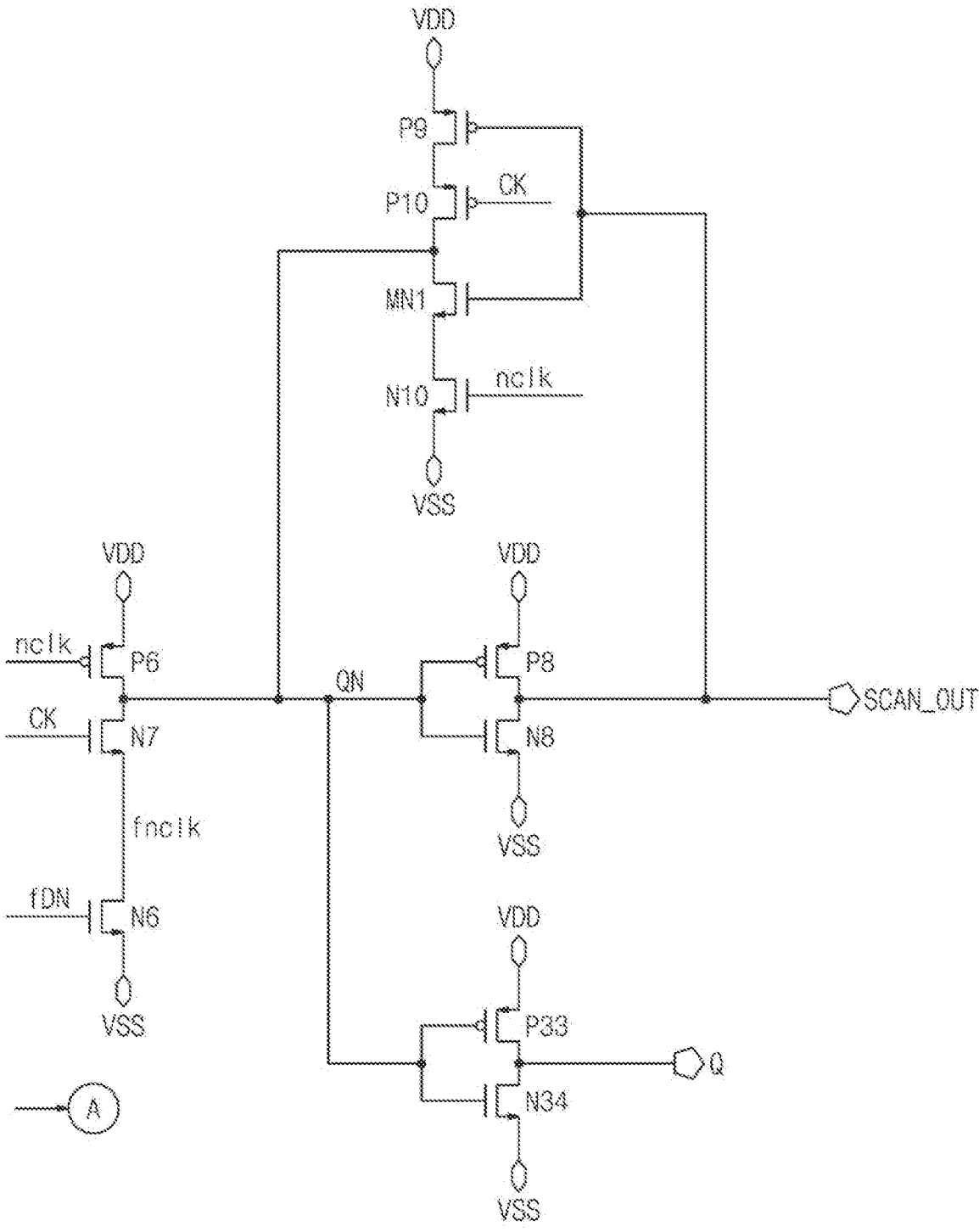

FIG. 3A and FIG. 3B are circuit diagrams (300) of a Scannable D-Flip flop with an asynchronous reset pin and a Q pin that follows the same level of a D input signal (SDFFRPQ_1), according to an example embodiment. In an example embodiment, the SDFFRPQ_1 includes a multiplexer, a first clock gate circuit, a hybrid master latch (including a master latch and a clock signal generation circuit), a second clock gate, a slave latch, an inverted clock generation circuit and an output stage. The multiplexer includes a pull-up circuit and a pull-down circuit. The pull-up circuit includes a PMOS transistor (P16), a PMOS transistor (P15), a PMOS transistor (P4) and a PMOS transistor (P5). The pull-down circuit includes a NMOS transistor (N5), a NMOS transistor (N14), a NMOS transistor (N15), and a NMOS transistor (N16). An output of the pull-up circuit may be provided to the master latch based on an input of the scan enable pin (SE) of the pull-up circuit.

The first clock gate circuit includes a NMOS transistor (N24) and a PMOS transistor (P3). The NMOS transistor (N24) and the PMOS transistor (P3) allow an inverted input signal (D or SI) to be provided to a latch memory at a low state of the clock signal, where a multiplexed signal from the multiplexer is propagated to a master latch based on a clock state controlled by the NMOS transistor (N24) and the PMOS transistor (P3). The latch memory may include the master latch, and the master latch may include a forward path and a reverse path.

The hybrid master latch includes the master latch and the clock signal generation circuit. The forward path of the master latch includes a PMOS transistor (MP1) and a NMOS transistor (N17), and the reverse path of the master latch includes a PMOS transistor (P23) and NMOS transistors (N22 and N23). An output signal of the master latch is a signal (fDN), which is propagated based on a state of the second clock gate circuit. A nclk signal is generated at the clock signal generation circuit, where the clock signal generation circuit includes PMOS transistors (P17 and P18) and NMOS transistors (N17 and N18).

The second clock gate includes a pull-up circuit having a PMOS transistor (P6) and a pull-down circuit having NMOS transistors (N6 and N7). The signal (fDN) is propagated to a slave latch of the second clock gate and to an output inverter of the output stage depending on a state of CK signal and the nclk signal. The slave latch may include a forward path and a reverse path. The slave latch stores a signal when a clock (CK) state is at a high level (i.e., one) and keeps the output signal (Q) from going to a high impedance state when CK state is at a low level (i.e., zero) for a rising clock edge triggered flip flop.

The output stage receives a scan-out signal output (SCAN_OUT) from the forward path of the slave latch, where the forward path includes a PMOS transistor (P8) and a NMOS transistor (N8), where a scan-out signal output of a CMOS inverter formed by the PMOS transistor (P8) and the NMOS transistor (N8) have same polarity as output pin (Q0). The reverse path of the slave latch includes PMOS transistors (P9 and P10) and NMOS transistors (MN1 and N10).

The output stage includes a PMOS transistor (P33) and a NMOS transistor (N34), wherein a signal of the output stage is stored by the slave latch. The inverted clock generation circuit is configured to provide a positive-active asynchronous reset (R) function, where the inverted clock generation circuit includes PMOS transistors (P17 and P18) and NMOS transistors (N17 and N18), wherein the inverted clock generation circuit is provided with the hybrid master latch.

Figure 4A:
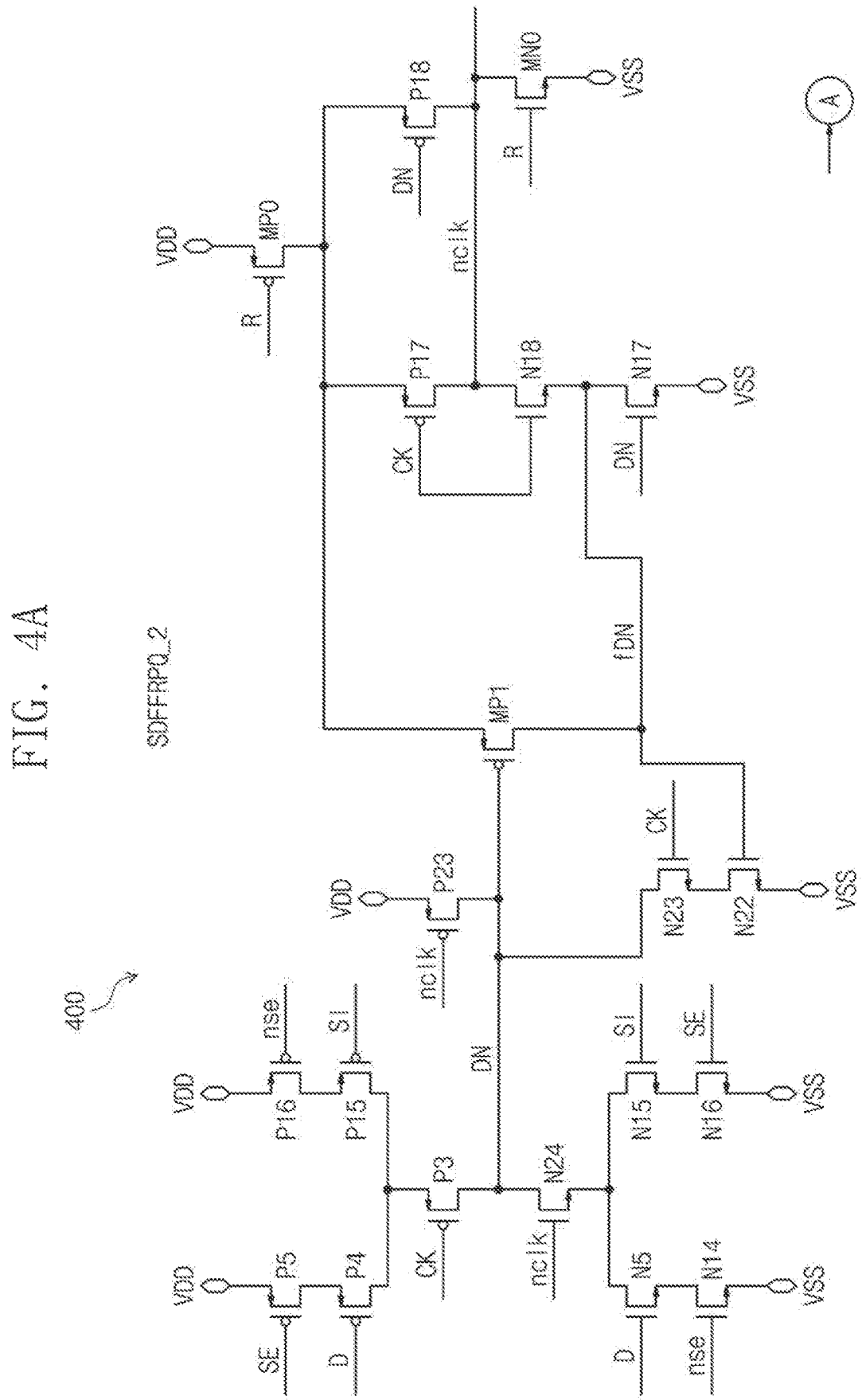
FIG. 4A and FIG. 4B are circuit diagrams of a Scannable D-Flipflop with an asynchronous reset pin and a Q pin that follows the same level as a D input signal (SDFFRPQ_2), according to an example embodiment.
Figure 4B:
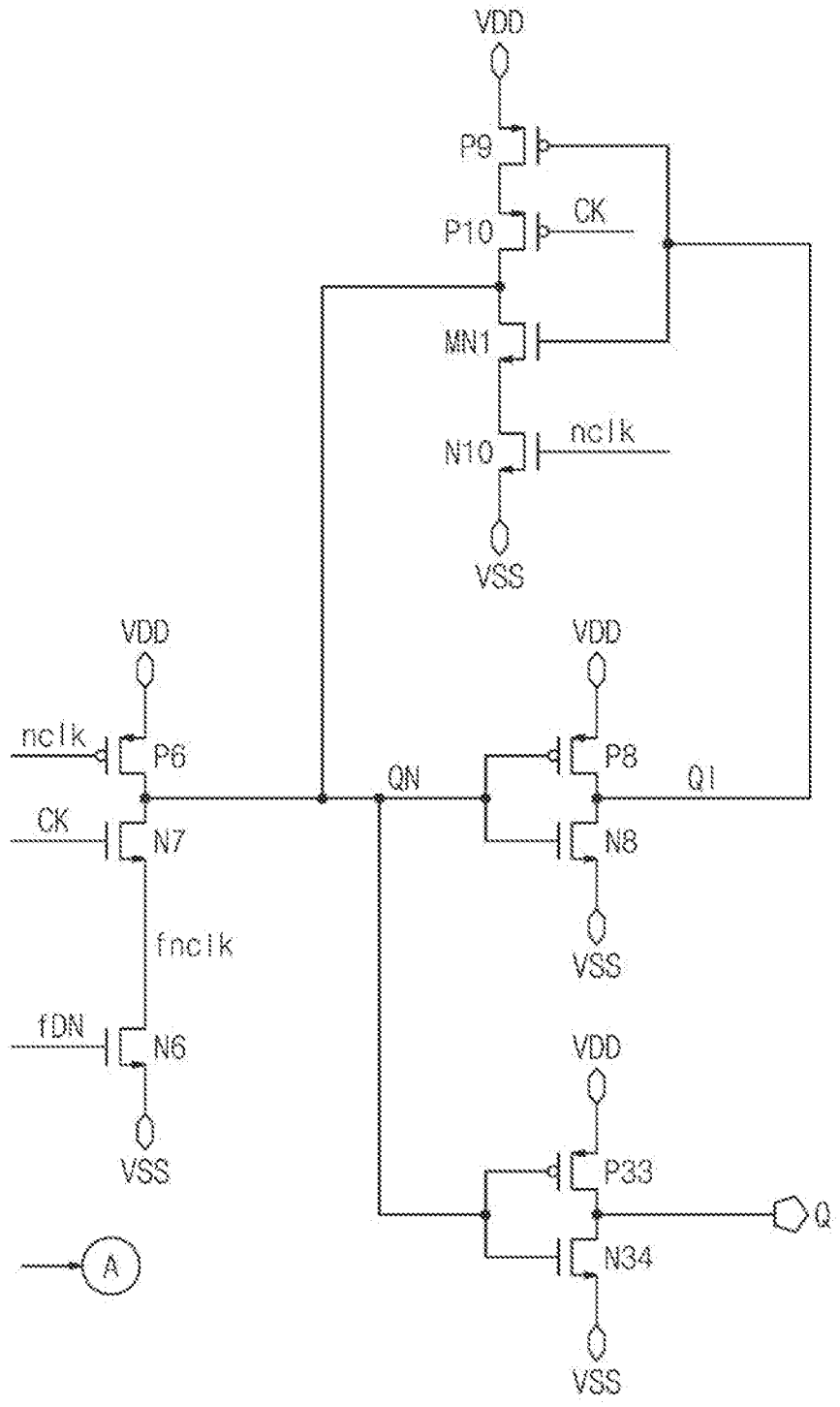

FIG. 4A and FIG. 4B are circuit diagrams (400) of a Scannable D-Flip flop with an asynchronous reset pin and a Q pin that follows the same level of a D input signal (SDFFRPQ_2), according to an example embodiment. In an example embodiment, the SDFFRPQ_2 includes a multiplexer, a first clock gate circuit, a hybrid master latch (including a master latch and a clock signal generation circuit), a second clock gate, a slave latch, an inverted clock generation circuit and an output stage. The multiplexer includes a pull-up circuit and a pull-down circuit, where the pull-up circuit includes a PMOS transistor (P16), a PMOS transistor (P15), a PMOS transistor (P4) and a PMOS transistor (P5). The pull-down circuit includes a NMOS transistor (N5), a NMOS transistor (N14), a NMOS transistor (N15), and a NMOS transistor (N16). An output of the pull-up circuit may be provided to the master latch based on an input of the scan enable pin (SE).

The first clock gate circuit includes a NMOS transistor (N24) and a PMOS transistor (P3), where the NMOS transistor (N24) and the PMOS transistor (P3) allow an inverted input signal (D or SI) to be provided to a latch memory at a low state of the clock signal, wherein a multiplexed signal from the multiplexer is propagated to the master latch based on a clock state controlled by the NMOS transistor (N24) and the PMOS transistor (P3). The latch memory may include the master latch, and the master latch may include a forward path and a reverse path.

The hybrid master latch includes the master latch and the clock signal generation circuit. The forward path of the master latch includes a PMOS transistor (MP1) and a NMOS transistor (N17). The reverse path of the master latch includes a PMOS transistor (P23) and NMOS transistors (N22 and N23). An output signal of the master latch is a signal (fDN), which is propagated based on a state of the second clock gate circuit.

A nclk signal is generated at the clock signal generation circuit, where the clock signal generation circuit includes PMOS transistors (P17 and P18) and NMOS transistors (N17 and N18). The second clock gate includes a pull-up circuit having a PMOS transistor (P6) and a pull-down circuit having NMOS transistors (N6 and N7). The signal (fDN) is propagated to a slave latch of the second clock gate and to an output inverter of the output stage depending on a state of CK signal and the nclk signal. The slave latch may include a forward path and a reverse path. The slave latch stores a signal when a clock (CK) state is at a high level (i.e., one) and keeps the output signal (Q) from going to a high impedance state when CK state is at a low level (i.e., zero) for a rising clock edge triggered flip flop. A CMOS inverter includes the PMOS transistor (P8) and the NMOS transistor (N8). The reverse path of the slave latch includes PMOS transistors (P9 and P10) and NMOS transistors (MN1 and N10). The output stage includes a PMOS transistor (P33) and a NMOS transistor (N34), wherein a signal of the output stage is stored by the slave latch. The inverted clock generation circuit is configured to provide a positive-active asynchronous reset (R) function, where the inverted clock generation circuit includes PMOS transistors (P17 and P18) and NMOS transistors (N18 and N17). The inverted clock generation circuit is provided with the hybrid master latch.

Figure 5A:
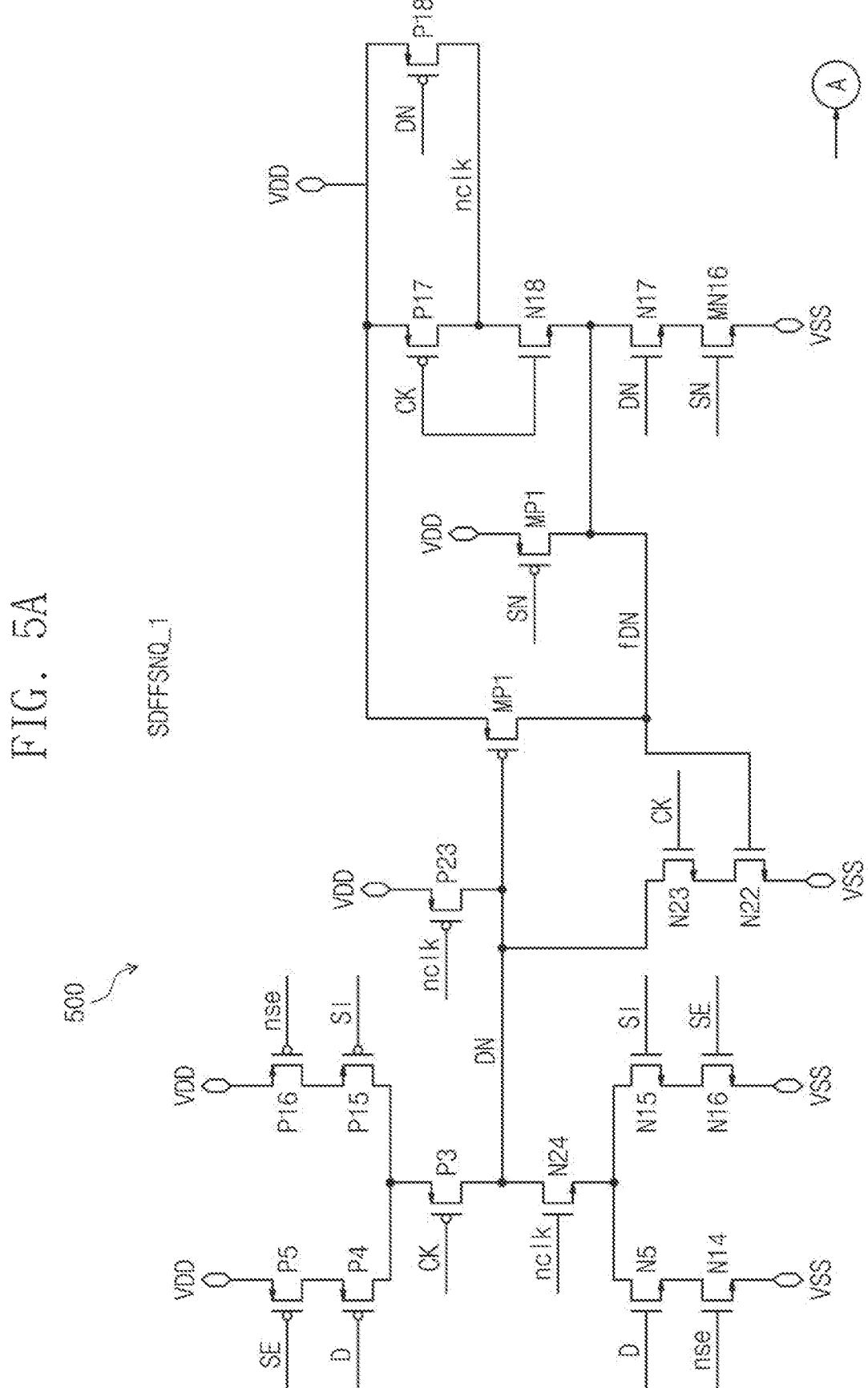
FIG. 5A and FIG. 5B are circuit diagrams of a Scannable D-Flipflop with an asynchronous set pin and a Q pin that follows the same level as D input signal (SDFFSNQ_1), and clamps the Q output to a high level when a set pin is asserted, according to an example embodiment.
Figure 5B:
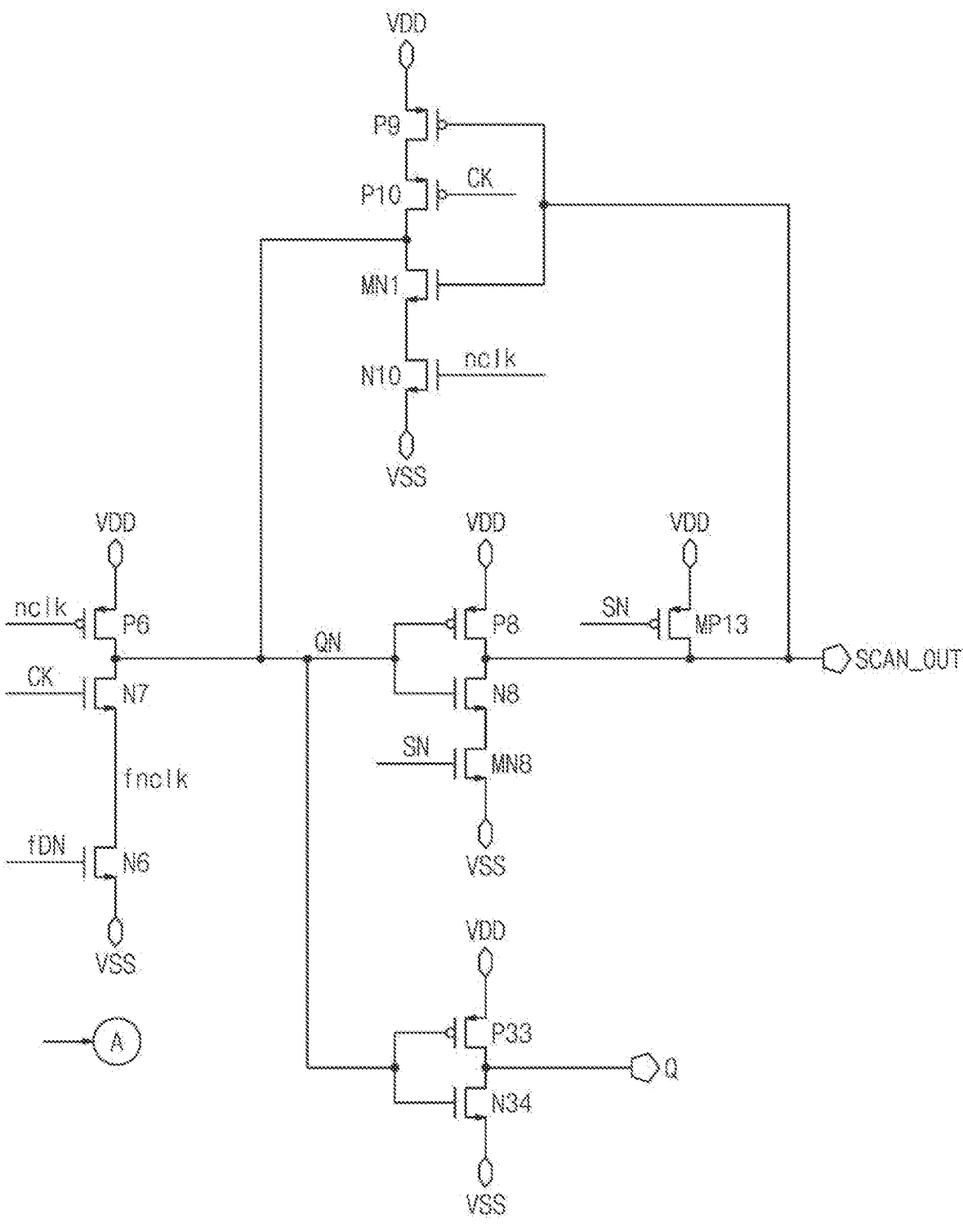

FIG. 5A and FIG. 5B are circuit diagrams (500) of a Scannable D-Flip flop with an asynchronous set pin and a Q pin that follows the same level of a D input signal (SDFF-SNQ_1), when a set pin is asserted the Q output is clamped to a High level (SDFFSNQ_1), according to an example embodiment. In an example embodiment, the SDFFSNQ_1 includes a multiplexer, a first clock gate circuit, a hybrid master latch (including a master latch and a clock signal generation circuit), a second clock gate, a slave latch, an inverted clock generation circuit and an output stage. The multiplexer includes a pull-up circuit and a pull-down circuit. The pull-up circuit includes a PMOS transistor (P16), a PMOS transistor (P15), a PMOS transistor (P4) and a PMOS transistor (P5). The pull-down circuit includes a NMOS transistor (N5), a NMOS transistor (N14), a NMOS transistor (N15), and a NMOS transistor (N16). An output of the pull-up circuit may be provided to the master latch based on an input of the scan enable pin (SE) provided to the pull-up circuit. The first clock gate circuit includes a NMOS transistor (N24) and a PMOS transistor (P3). The NMOS transistor (N24) and the PMOS transistor (P3) allow an inverted input signal (D or SI) to be provided to a latch memory at a low state of the clock signal. The latch memory may include the master latch, and the master latch may include a forward path and a reverse path. The multiplexed signal from the multiplexer is propagated to the master latch based on a clock state controlled by the NMOS transistor (N24) and the PMOS transistor (P3).

The hybrid master latch includes the master latch and the clock signal generation circuit. The forward path of the master latch includes a PMOS transistor (MP1) and a NMOS transistor (N17). The reverse path of the master latch includes a PMOS transistor (P23) and NMOS transistors (N22 and N23). An output signal of the master latch is a signal (fDN), which is propagated based on a state of a second clock gate circuit. A nclk signal is generated at the clock signal generation circuit, where the clock signal generation circuit includes PMOS transistors (P17 and P18) and NMOS transistors (N17, N18 and MN16).

The second clock gate includes a pull-up circuit having a PMOS transistor (P6) and a pull-down circuit having NMOS transistors (N6 and N7). The signal (fDN) is propagated to a slave latch of the second clock gate and to an output inverter of the output stage depending on a state of CK signal and the nclk signal.

The slave latch may include a forward path and a reverse path. The slave latch stores a signal when a clock (CK) state is at a high level (i.e., one) and keeps the output signal (Q) from going to a high impedance state when CK state is at a low level (i.e., zero) for a rising clock edge triggered flip flop. The output stage receives a scan-out signal output (SCAN_OUT) from the forward path of the slave latch. The forward path includes a PMOS transistor (P8) and a NMOS transistors (N8 and MN8). A scan-out signal output of a CMOS inverter formed by the PMOS transistor (P8) and the NMOS transistor (N8) may have the same polarity as output pin (Q0). The reverse path of the slave latch includes PMOS transistors (P9 and P10) and NMOS transistors (MN1 and N10). The output stage includes a PMOS transistor (P33) and a NMOS transistor (N34), where a signal of the output stage is stored by the slave latch.

The inverted clock generation circuit is configured to provide a scan and asynchronous function, wherein the inverted clock generation circuit includes PMOS transistors (P12, P16, and P17) and NMOS transistors (N16, N20 and N21). The inverted clock generation circuit is provided with the hybrid master latch.

Figure 6A:
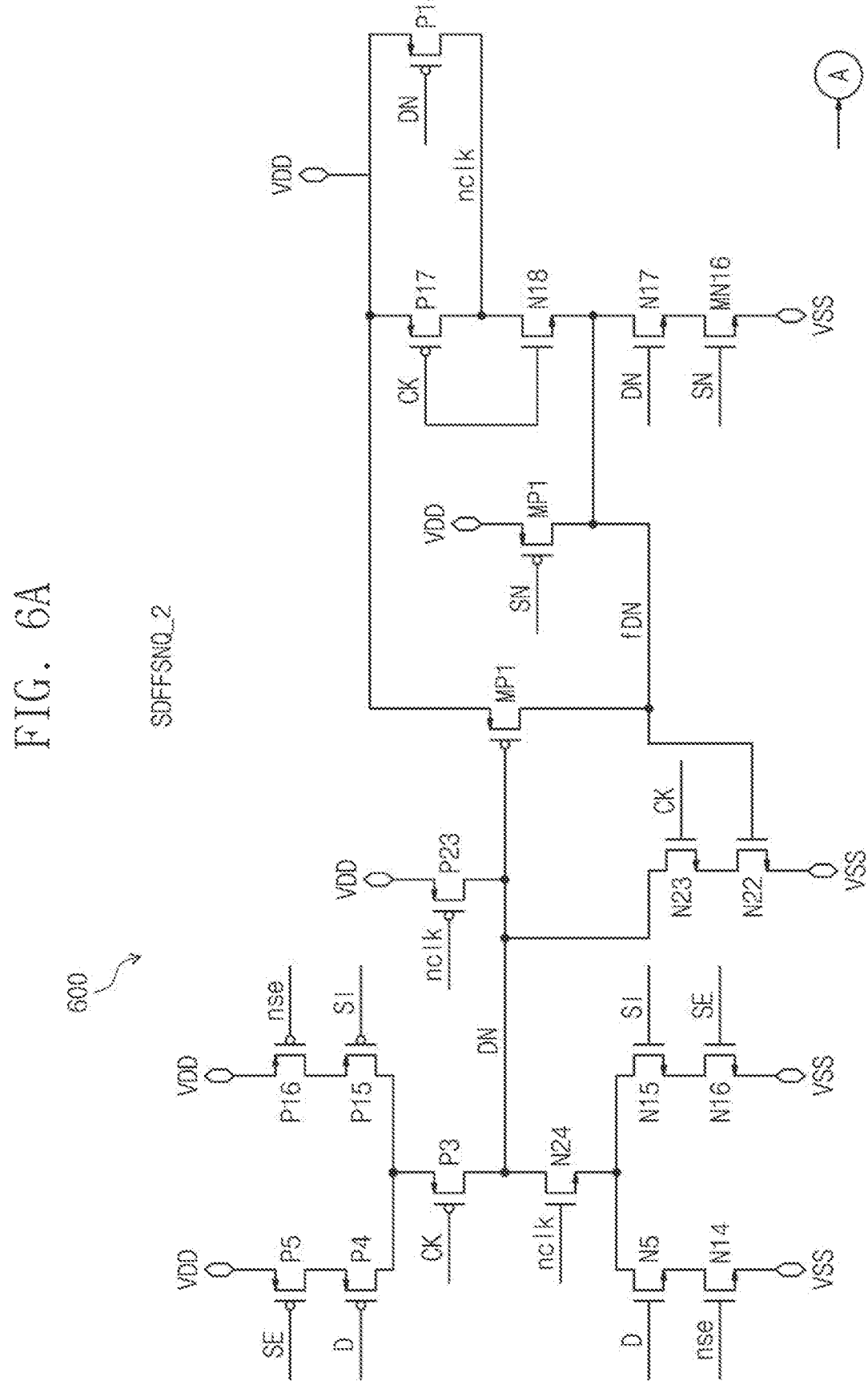
FIG. 6A and FIG. 6B are circuit diagrams of a SDFF-SNQ_2, according to an example embodiment.
Figure 6B:
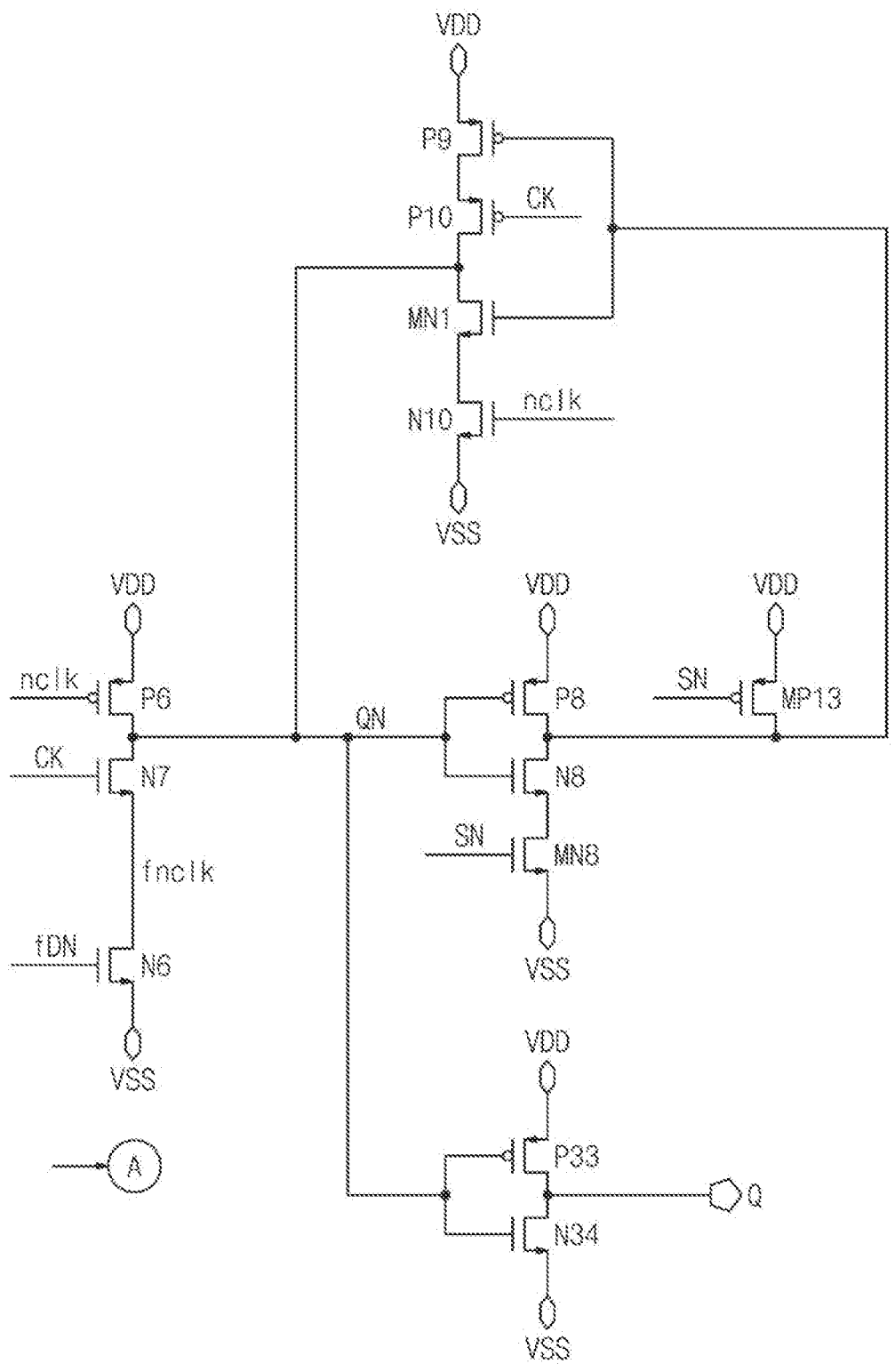

FIG. 6A and FIG. 6B are circuit diagrams (600) of a SDFFSNQ_2, according to an example embodiment. In an example embodiment, the SDFFSNQ_2 includes a multiplexer, a first clock gate circuit, a hybrid master latch (including a master latch and a clock signal generation circuit), a second clock gate, a slave latch, an inverted clock generation circuit and an output stage. The multiplexer includes a pull-up circuit and a pull-down circuit. The pull-up circuit includes a PMOS transistor (P16), a PMOS transistor (P15), a PMOS transistor (P4) and a PMOS transistor (P5). The pull-down circuit includes a NMOS transistor (N5), a NMOS transistor (N14), a NMOS transistor (N15), and a NMOS transistor (N16). An output of the pull-up circuit may be provided to the master latch based on an input of the scan enable pin (SE) provided to the pull-up circuit.

The first clock gate circuit includes a NMOS transistor (N24) and a PMOS transistor (P3). The NMOS transistor (N24) and the PMOS transistor (P3) allow an inverted input signal (D or SI) to be provided to a latch memory at a low state of the clock signal. The latch memory may include the master latch, and the master latch may include a forward path and a reverse path. A multiplexed signal from the multiplexer is propagated to the master latch based on a clock state controlled by the NMOS transistor (N24) and the PMOS transistor (P3).

The hybrid master latch includes the master latch and the clock signal generation circuit. The forward path of the master latch includes a PMOS transistor (MP1) and a NMOS transistor (N17). The reverse path of the master latch includes a PMOS transistor (P23) and NMOS transistors (N22 and N23). An output signal of the master latch is a signal (fDN), which is propagated based on a state of a second clock gate circuit. A nclk signal is generated at the clock signal generation circuit, where the clock signal generation circuit includes PMOS transistors (P17 and P18) and NMOS transistors (N17, N18 and MN16).

The second clock gate includes a pull-up circuit having a PMOS transistor (P6) and a pull-down circuit having NMOS transistors (N6 and N7). The signal (fDN) is propagated to a slave latch of the second clock gate and to an output inverter of the output stage depending on a state of CK signal and the nclk signal. The slave latch may include a forward path and a reverse path. The slave latch stores a signal when a clock (CK) state is at a high level (i.e., one) and keeps the output signal (Q) from going to a high impedance state when CK state is at a low level (i.e., zero) for a rising clock edge triggered flip flop. A scan-out signal output of a CMOS inverter formed by the PMOS transistor (P8) and the NMOS transistor (N8) is having same polarity as output pin (Q0). The reverse path of the slave latch includes PMOS transistors (P9 and P10) and NMOS transistors (MN1 and N10). The output stage includes a PMOS transistor (P33) and a NMOS transistor (N34), wherein a signal of the output stage is stored by the slave latch. An inverted clock generation circuit is provided, and configured to provide a scan and asynchronous function. The inverted clock generation circuit includes PMOS transistors (P12, P16, and P17) and NMOS transistors (N16, N20 and N21), wherein the inverted clock generation circuit is provided with the hybrid master latch.

Figure 7:
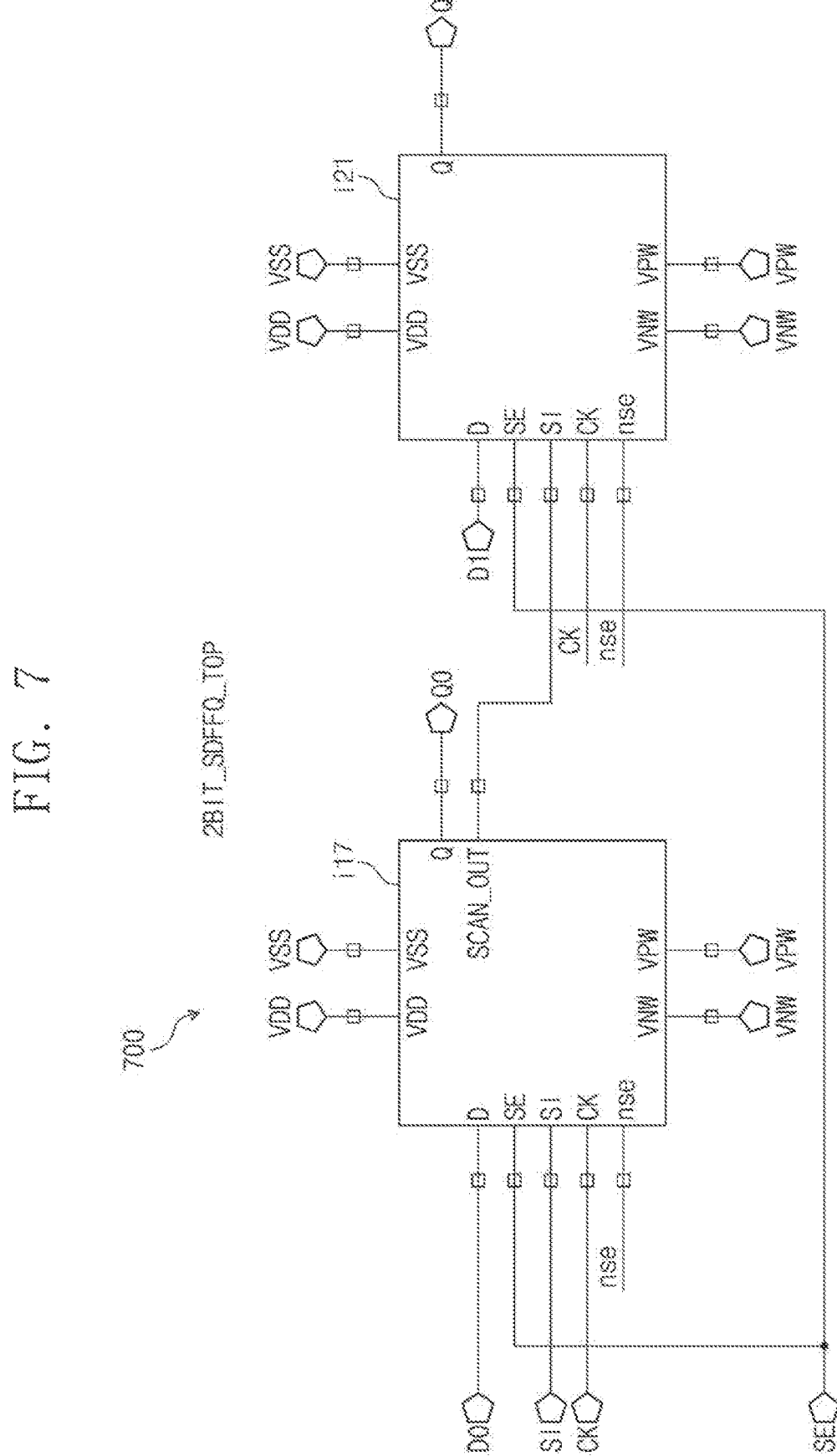
FIG. 7 is a circuit diagram of a 2 bit scannable D-flipflop with a Q pin that follows the same level of a D input pin, (2BIT_SDFFQ_TOP) and a common clock pin, according to an example embodiment.
Figure 8:
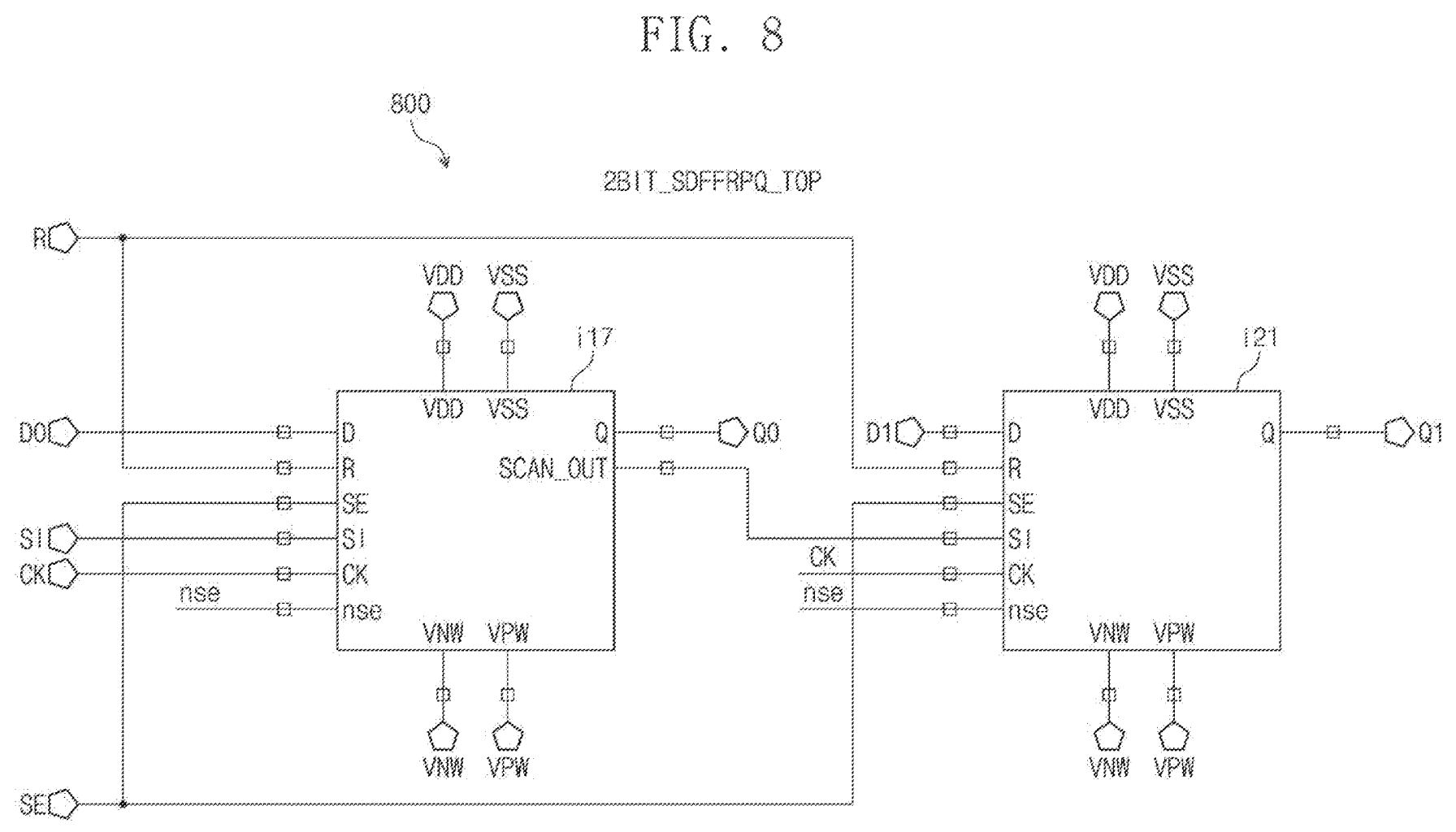
Figure 9:
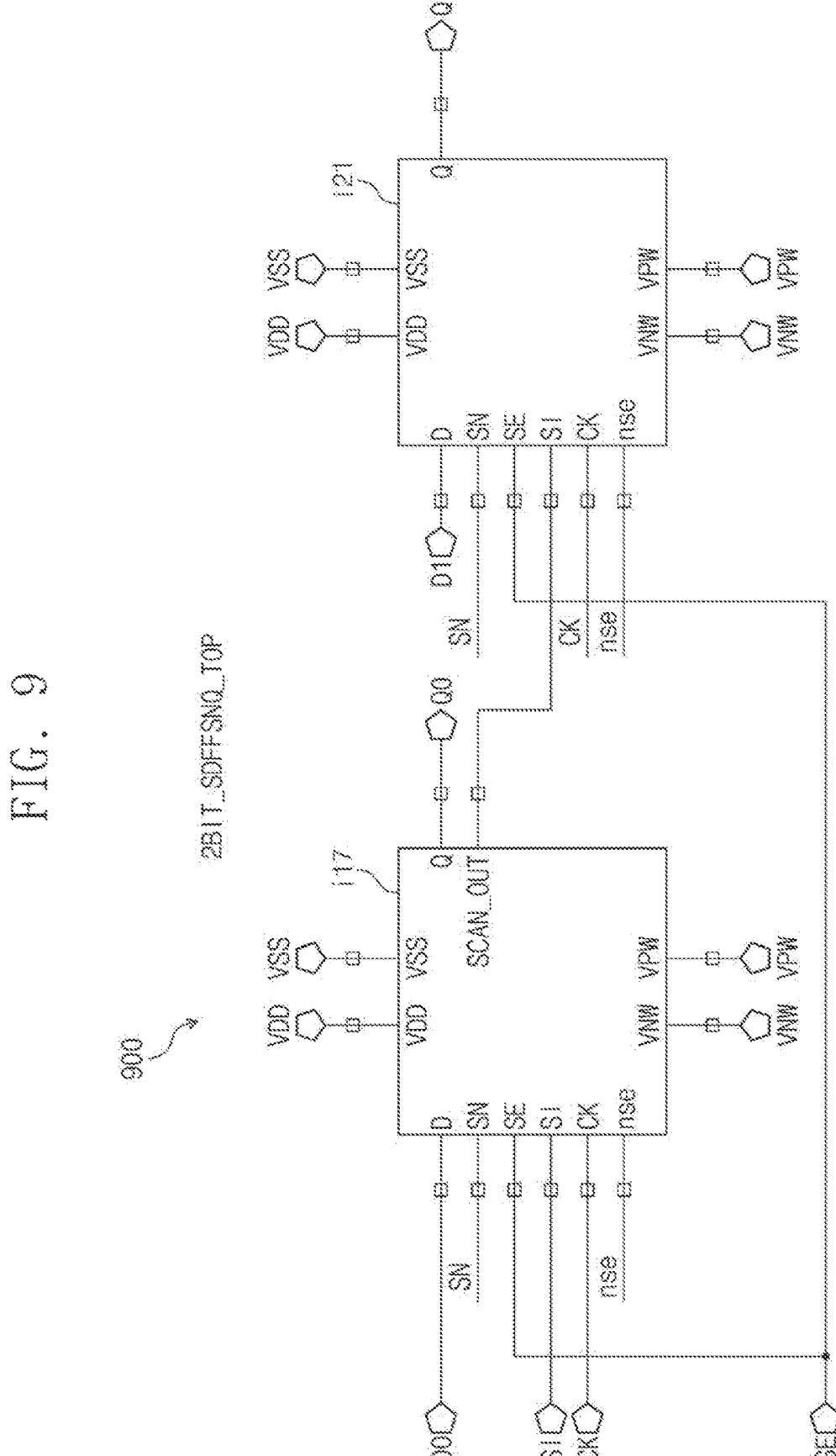
FIG. 9 is a circuit diagram of a 2 bit Scannable D-Flipflop with an asynchronous set pin and a Q pin that follows the same level as a D input signal (2BIT_SDFFSNQ_TOP), and clamps the Q output to a high level when the set pin is asserted, according to an example embodiment.

FIG. 7 is a circuit diagram (700) of a 2 bit scannable D-flip flop with a Q pin that follows the same level of a D input pin, (2BIT_SDFFQ_TOP) and they have a common clock pin, according to an example embodiment. FIG. 8 is a circuit diagram (800) of a 2 bit Scannable D-Flip flop with an asynchronous reset pin and a Q pin that follows the same level of a D input signal (2BIT_SDFFRPQ_TOP) and they have common clock pin, according to an example embodiment. FIG. 9 is a circuit diagram (900) of a 2 bit Scannable D-Flip flop with an asynchronous set pin and a Q pin that follows the same level of a D input signal (2BIT_SDFFSNQ_TOP) and they have a common clock pin, according to an example embodiment.

As shown in FIG. 7 to FIG. 9, a multibit flip flop may be provided in a standard cell library. The multibit flip flop includes a first stage one-bit flip flop 17 and a second stage one-bit flip flop 21. In an example embodiment, the first stage one-bit flip flop 17 can be, for example, but is not limited to a the SDFFQ_1 (explained with reference to FIG. 1A and FIG. 1B), the SDFFRPQ_1 (explained with reference to FIG. 3A and FIG. 3B), or the SDFFSNQ_1 (explained with reference to FIG. 5A and FIG. 5B). In an example embodiment, the second stage one-bit flip flop 21 can be, for example, but is not limited to the SDFFQ_2 (explained with reference to FIG. 2A and FIG. 2B), the SDFFRPQ_2 (explained with reference to FIG. 4A and FIG. 4B), or the SDFFSNQ_2 (explained with reference to FIG. 6A and FIG. 6B). For the sake of brevity, a repeated description will not be provided.

The first stage one-bit flip flop 17 and the second stage one-bit flip flop 21 share the same CK in the multibit flip flop. The first stage one-bit flip flop 17 and the second stage one-bit flip flop 21 use the inter cell scan input transfer function in a sequential manner in the multibit flip flop. The scan input signal feeds to the input port of the first stage one-bit flip flop 17 to provide the scan output signal, where the scan output signal feeds to the input port of the second stage one-bit flip flop 21 to provide a scan final output signal. The data signal (DO) available on an output pin (Q0) at a positive edge of the clock signal (CK) based on a state of scan enable pin (SE) of the multibit flip flop. The scan input signal (SI) available on the output pin (Q0) at a positive edge trigger of the clock signal (CK) based on a state of scan enable pin (SE) of the multibit flip flop.

Figure 10:
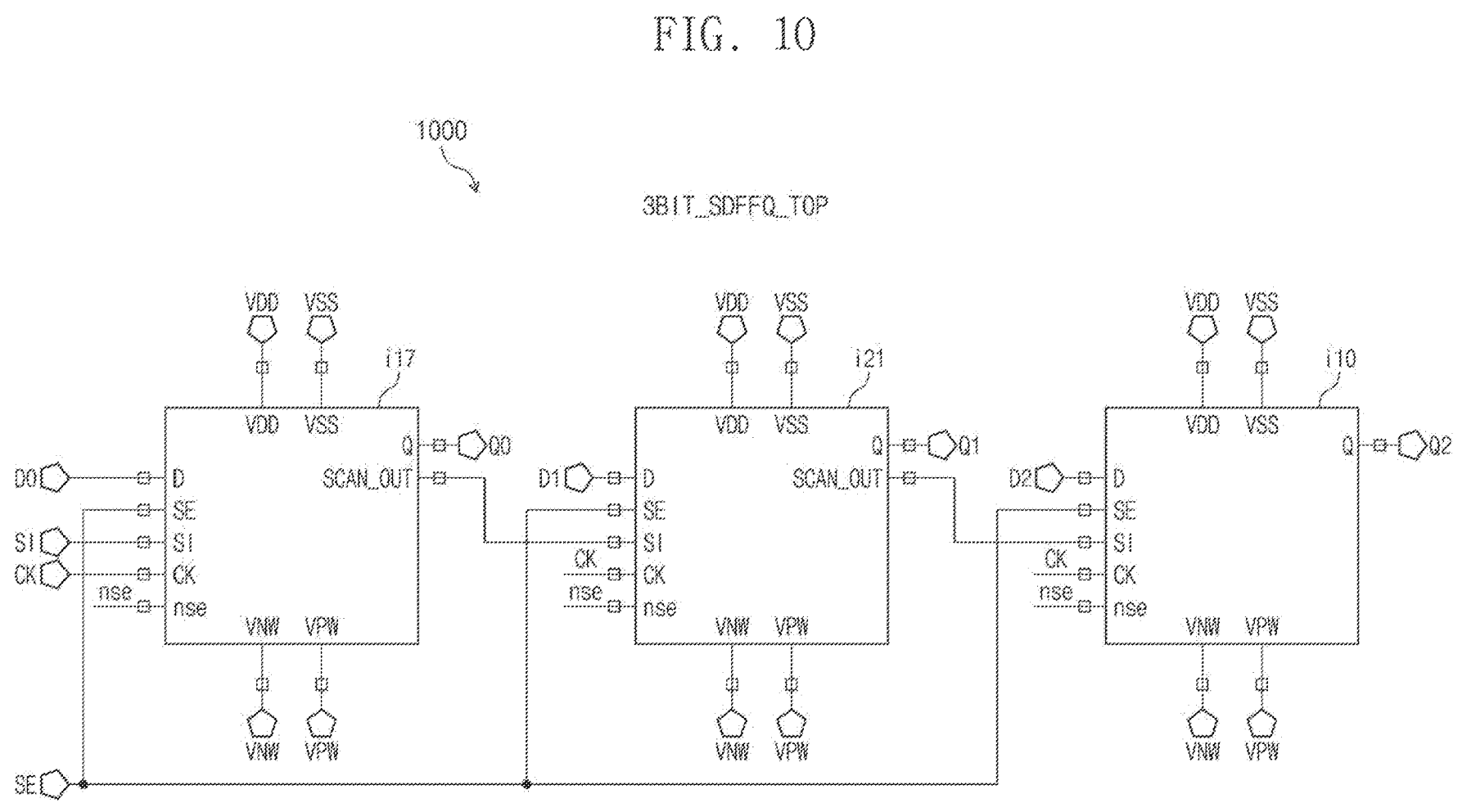
Figure 11:
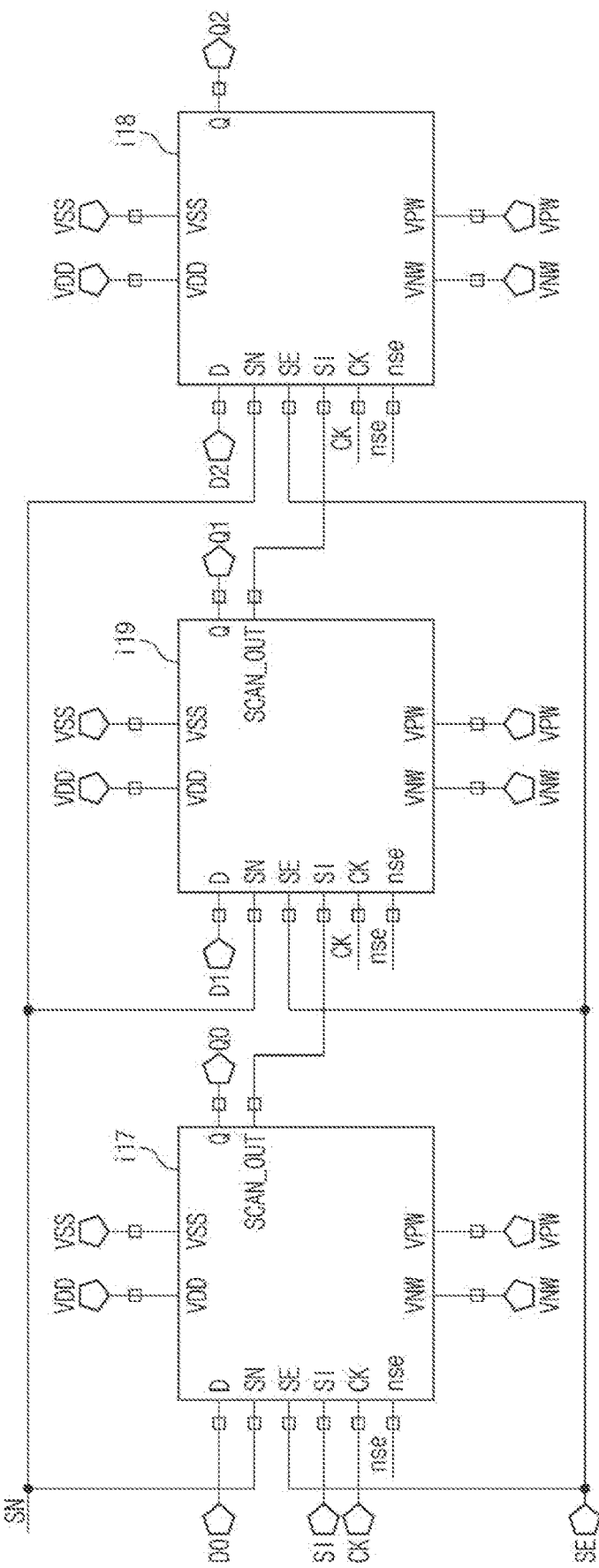
FIG. 11 is a circuit diagram of a 3 bit Scannable D-Flipflop with an asynchronous set pin and a Q pin that follows the same level as a D input signal (3BIT_SDFFSNQ_TOP), and clamps the Q output to a high level when the set pin is asserted, according to an example embodiment.
Figure 12A:
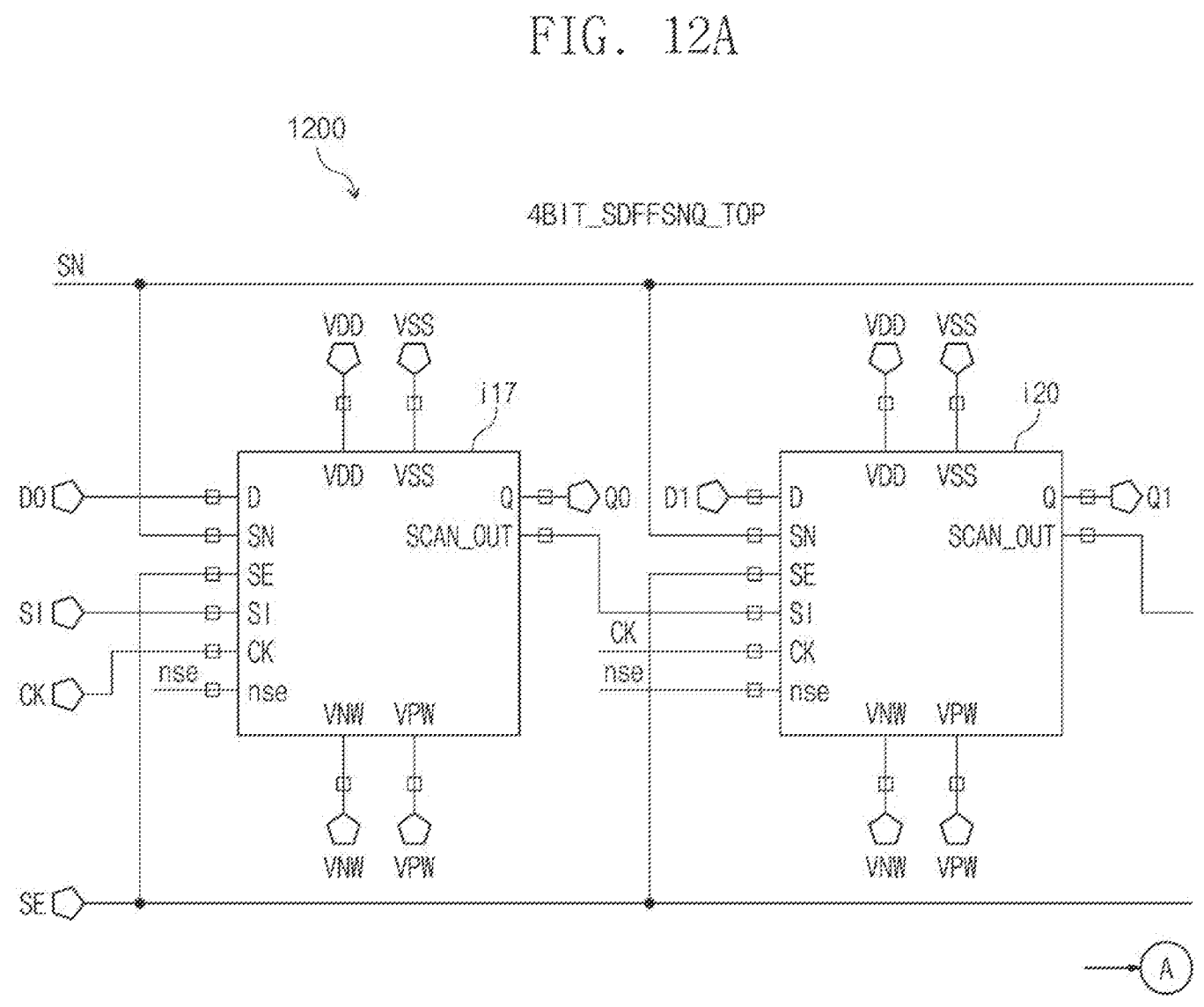
Figure 12B:
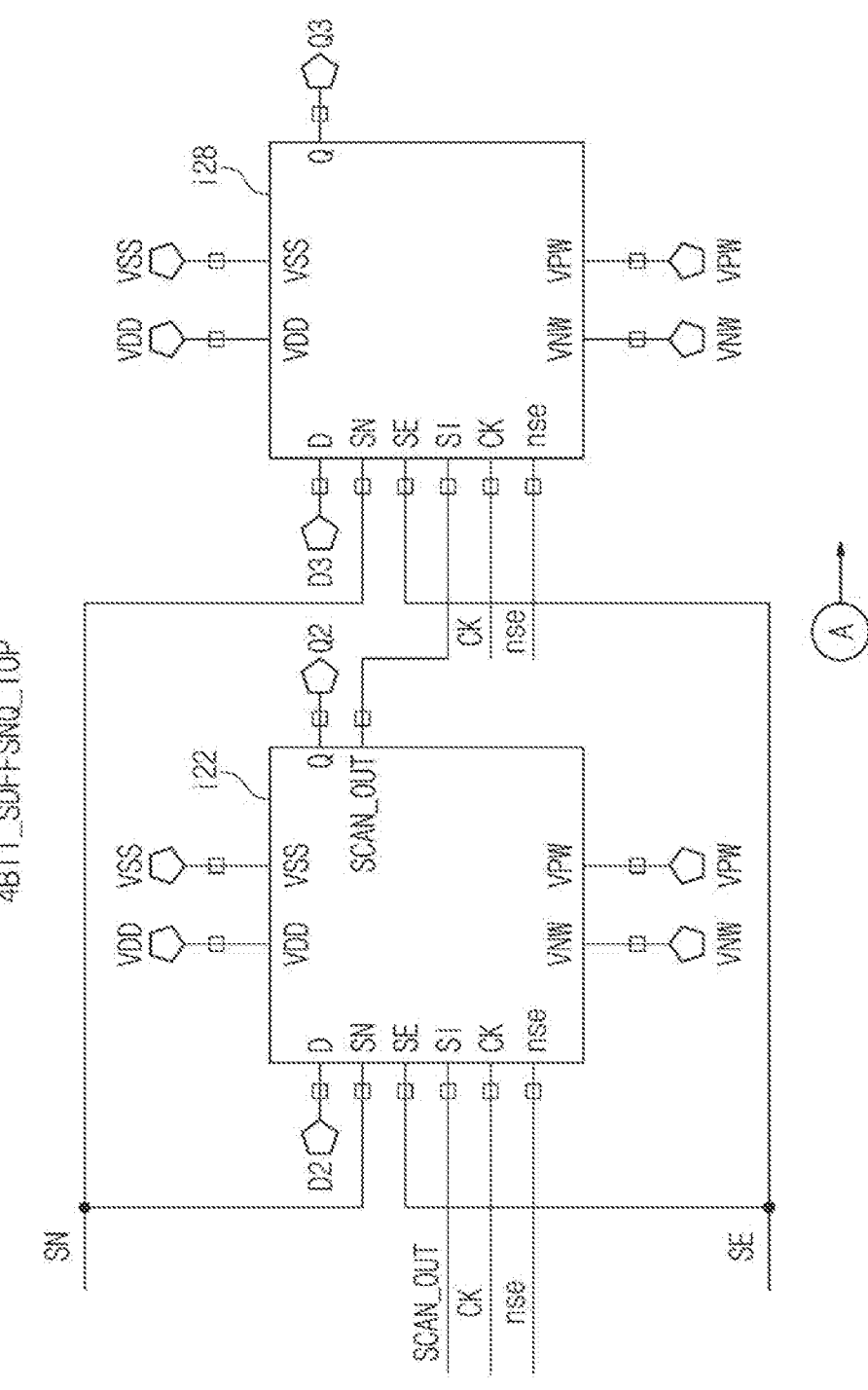

FIG. 10 is a circuit diagram (1000) of a 3 bit scannable D-flip flop with a Q pin that follows the same level of a D input pin (3BIT_SDFFQ_TOP) and they have a common clock pin, according to an example embodiment. FIG. 11 is a circuit diagram (1100) of a 3 bit Scannable D-Flip flop with an asynchronous set pin and a Q pin that follows the same level of a D input signal (3BIT_SDFFSNQ_TOP) when set pin is asserted the Q output is clamped to a high level, according to an example embodiment. FIGS. 12A and 12B are circuit diagrams (1200) of a 4 bit Scannable D-Flip flop with an asynchronous set pin and a Q pin that follows the same level of a D input signal (4BIT_SDFFSNQ_TOP), when set pin is asserted the Q output is clamped to a high level, according to an example embodiment.

As shown in FIG. 10 to FIG. 12B, the multibit flip flop may be provided in a standard cell library. The multibit flip flop includes the first stage one-bit flip flop 17, the at least one intermediate stage one-bit flip flop 21, and the last stage one-bit flip flop 10. In an example embodiment, the first stage one-bit flip flop 17 or the at least one intermediate stage one-bit flip flop 21 can be, for example, but not limited to the SDFFQ_1 (explained with reference to FIG. 1A and FIG. 1B), the SDFFRPQ_1 (explained with reference to FIG. 3A and FIG. 3B), or SDFFSNQ_1 (explained with reference to FIG. 5A and FIG. 5B). In an example embodiment, the last stage one-bit flip flop 10 can be, for example, but is not limited to the SDFFQ_2 (explained with reference to FIG. 2A and FIG. 2B), the SDFFRPQ_2 (explained with reference to FIG. 4A and FIG. 2B), or the SDFFSNQ_2 (explained with reference to FIG. 6A and FIG. 6B).

The first stage one-bit flip flop 17, the at least one intermediate stage one-bit flip flop 21 and the last stage one-bit flip flop 10 share a same clock signal of the multibit flip flop. The first stage one-bit flip flop 17, the at least one intermediate stage one-bit flip flop 21 and the last stage one-bit flip flop 10 use an inter cell scan input transfer function in a sequential manner in the multibit flip flop. A scan input signal feeds to an input port of the first stage one-bit flip flop 17 to provide a scan output signal, wherein the scan output signal feeds to an input port of the at least one intermediate stage one-bit flip flop 21 to provide a scan intermediate output signal. The scan intermediate output signal feeds to an input port of the last stage one-bit flip flop 10 to provide a scan final output signal.

FIG. 13 is a flow chart (1300) illustrating a method for configuring a multibit flip flop for a standard cell library, according to an example embodiment. At S1302, the method includes providing a first stage one-bit flip flop and a second stage one-bit flip flop. The first stage one-bit flip flop and the second stage one-bit flip flop share the same clock signal (CK) in the multibit flip flop. The first stage one-bit flip flop and the second stage one-bit flip flop use the inter cell scan input transfer function in a sequential manner in the multibit flip flop. At S1304, the method includes feeding the scan input signal to the input port of the first stage one-bit flip flop to provide the scan output signal. At S1306, the method includes feeding the scan output signal to the input port of the second stage one-bit flip flop to provide the scan final output signal.

FIG. 14 is a flow chart (1400) illustrating a method for configuring a multibit flip flop for a standard cell library, according to an example embodiment. At 1402, the method includes providing a first stage one-bit flip flop, at least one intermediate stage one-bit flip flop and a last stage one-bit flip flop. The first stage one-bit flip flop, the at least one intermediate stage one-bit flip flop and the last stage one-bit flip flop share a same clock signal of the multibit flip flop. The first stage one-bit flip flop, the at least one intermediate stage one-bit flip flop and the last stage one-bit flip flop uses an inter cell scan input transfer function in a sequential manner in the multibit flip flop. At 1404, the method includes feeding a scan input signal to an input port of the first stage one-bit flip flop to provide a scan output signal. At 1406, the method includes feeding the scan output signal to an input port of the at least one intermediate stage one-bit flip flop to provide a scan intermediate output signal. At 1408, the method includes feeding the scan intermediate output signal to an input port of the last stage one-bit flip flop to provide a scan final output signal.

The various actions, acts, blocks, steps, or the like in the flow charts (1300 and 1400) may be performed in the order presented, in a different order or simultaneously. Further, in some example embodiments, some of the actions, acts, blocks, steps, or the like may be omitted, added, modified, skipped, or the like without departing from the scope of the present disclosure.

While aspects of example embodiments have been particularly shown and described, it will be understood that various changes in form and details may be made therein without departing from the spirit and scope of the following claims.

What is claimed is:

1. A multibit flip flop comprising:
   a first stage one-bit flip flop; and
   a second stage one-bit flip flop, wherein the first stage one-bit flip flop and the second stage one-bit flip flop are configured to share a common clock signal,
   wherein the first stage one-bit flip flop and the second stage one-bit flip flop are configured to use an inter cell scan input transfer function in a sequential manner,
   wherein the first stage one-bit flip flop is further configured to provide a scan output signal based on a scan input signal provided at an input port of the first stage one-bit flip and flop,
   wherein the second stage one-bit flip flop is further configured to provide a scan final output signal based on the scan output signal that is provided at an input port of the second stage one-bit flip flop, and wherein the first stage one-bit flip flop comprises a multiplexer and a master latch, wherein the multiplexer comprises a first pull-up circuit and a first pull-down circuit, wherein the multiplexer is configured to provide an input of a scan enable pin to the first pull-up circuit, generate an output, and provide the output to the master latch of the first stage one-bit flip flop.

2. The multibit flip flop as claimed in claim 1, wherein the first stage one-bit flip flop is further configured to provide:

a data signal on an output pin at a positive edge of the common clock signal based on a state of the scan enable pin of the multibit flip flop; or the scan input signal on the output pin at the positive edge of the common clock signal based on the state of the scan enable pin of the multibit flip flop.

3. The multibit flip flop as claimed in claim 1, wherein the second stage one-bit flip flop is configured to provide:

a data signal on an output pin at a positive edge of the common clock signal based on a state of the scan enable pin of the multibit flip flop; or the scan input signal on the output pin at the positive edge of the common clock signal based on the state of the scan enable pin of the multibit flip flop.

4. The multibit flip flop as claimed in claim 1, wherein the first pull-up circuit of the first stage one-bit flip flop comprises a first p-channel metal-oxide semiconductor (PMOS) transistor, a second PMOS transistor, a third PMOS transistor and a fourth PMOS transistor, wherein the first pull-down circuit of the first stage one-bit flip flop comprises a first n-channel metal-oxide semiconductor (NMOS) transistor, a second NMOS transistor, a third NMOS transistor, and a fourth NMOS transistor, wherein the first stage one-bit flip flop comprises:

a first clock gate circuit comprising a fifth NMOS transistor and a fifth PMOS transistor, wherein the fifth NMOS transistor and the fifth PMOS transistor are configured to allow an inverted input signal to be provided to a latch memory at a low state of the common clock signal, wherein a multiplexed signal from the multiplexer is provided to the master latch based on a clock state controlled by the fifth NMOS transistor and the fifth PMOS transistor;

a hybrid master latch comprising the master latch and a clock signal generation circuit, wherein a forward path of the master latch comprises a sixth PMOS transistor and a sixth NMOS transistor, wherein a reverse path of the master latch comprises a seventh PMOS transistor, a seventh NMOS transistor and an eighth NMOS transistor, wherein an output signal of the master latch is propagated based on a state of a second clock gate circuit;

wherein the clock signal generation circuit is configured to generate an nclk signal, wherein the clock signal generation circuit comprises an eighth PMOS transistor, a ninth PMOS transistor, a ninth NMOS transistor and a tenth NMOS transistor, wherein the second clock gate circuit comprises a second pull-up circuit comprising a tenth PMOS transistor and a second pull-down circuit comprising an eleventh NMOS transistor and a twelfth NMOS transistor, wherein the output signal of the master latch is propagated to a slave latch and an output inverter depending on a state of the common clock signal and the nclk signal, wherein the slave latch is configured to store a signal when the common clock signal is high and keep the output signal from going to a high impedance state when the common clock signal is low, wherein the multibit flip flop further comprises an output stage configured to receive a scan-out signal output from a forward path of the slave latch, wherein the forward path of the slave latch comprises an eleventh PMOS transistor and a thirteenth NMOS transistor, wherein the scan-out signal is output by a CMOS inverter formed by the eleventh PMOS transistor and the thirteenth NMOS transistor, and shares a common polarity with an output pin, wherein a reverse path of the slave latch comprises a twelfth PMOS transistor, a thirteenth PMOS transistor, a fourteenth NMOS transistor and a fifteenth NMOS transistor, wherein the output stage comprises a fourteenth PMOS transistor and a sixteenth NMOS transistor, and wherein a signal of the output stage is stored by the slave latch.

5. The multibit flip flop as claimed in claim 4, wherein the hybrid master latch comprises an inverted clock generation circuit configured to provide a positive-active asynchronous reset function, and wherein the inverted clock generation circuit comprises a fifteenth PMOS transistor, a sixteenth PMOS transistor, a seventeenth NMOS transistor and an eighteenth NMOS transistor.

6. The multibit flip flop as claimed in claim 4, wherein the hybrid master latch comprises an inverted clock generation circuit configured to provide a scan and asynchronous function, and wherein the inverted clock generation circuit comprises a fifteenth PMOS transistor, a sixteenth PMOS transistor, a seventeenth PMOS transistor, a seventeenth NMOS transistor, an eighteenth NMOS transistor and a nineteenth NMOS transistor.

7. The multibit flip flop as claimed in claim 1, wherein the second stage one-bit flip flop comprises:

a multiplexer comprising a first pull-up circuit and a first pull-down circuit, wherein the first pull-up circuit comprises a first p-channel metal-oxide semiconductor (PMOS) transistor, a second PMOS transistor, a third PMOS transistor and a fourth PMOS transistor, and wherein the first pull-down circuit comprises a first n-channel metal-oxide semiconductor (NMOS) transistor, a second NMOS transistor, a third NMOS transistor, and a fourth NMOS transistor, wherein the multiplexer is configured to provide an input of a scan enable pin to the first pull-up circuit, generate an output and provide the output to a master latch;

a first clock gate circuit comprising a fifth NMOS transistor and a fifth PMOS transistor, wherein the fifth NMOS transistor and the fifth PMOS transistor are configured to allow an inverted input signal to be provided to a latch memory at a low state of the common clock signal, wherein a multiplexed signal from the multiplexer is provided to the master latch based on a clock state controlled by the fifth NMOS transistor and the fifth PMOS transistor;

a hybrid master latch comprising the master latch and a clock signal generation circuit, wherein a forward path of the master latch comprises a sixth PMOS transistor and a sixth NMOS transistor, wherein a reverse path of the master latch comprises a seventh PMOS transistor, a seventh NMOS transistor and an eighth NMOS transistor, wherein an output signal of the master latch is propagated based on a state of a second clock gate circuit;

wherein the clock signal generation circuit is configured to generate an nclk signal, wherein the clock signal generation circuit comprises an eighth PMOS transistor, a ninth PMOS transistor, a ninth NMOS transistor and a tenth NMOS transistor, wherein the second clock gate circuit comprises a second pull-up circuit comprising a tenth PMOS transistor and a second pull-down circuit comprising an eleventh NMOS transistor and a twelfth NMOS transistor, wherein the output signal of the master latch is propagated to a slave latch and an output inverter depending on a state of the common clock signal and the nclk signal, wherein the slave latch is configured to store a signal when the common clock signal is high and keep the output signal from going to a high impedance state when the common clock signal is low, wherein a scan-out signal output of a CMOS inverter formed by an eleventh PMOS transistor and a thirteenth NMOS transistor, and an output pin have a common polarity, wherein a reverse path of the slave latch comprises a twelfth PMOS transistor, a thirteenth PMOS transistor, a fourteenth NMOS transistor and a fifteenth NMOS transistor, wherein the multibit flip flop further comprises an output stage comprising a fourteenth PMOS transistor and a sixteenth NMOS transistor, and wherein a signal of the output stage is stored by the slave latch.

8. The multibit flip flop as claimed in claim 7, wherein the hybrid master latch comprises an inverted clock generation circuit configured to provide a positive-active asynchronous reset function, and wherein the inverted clock generation circuit comprises a fifteenth PMOS transistor, a sixteenth PMOS transistor, a seventeenth NMOS transistor and an eighteenth NMOS transistor.

9. The multibit flip flop as claimed in claim 7, wherein the hybrid master latch comprises an inverted clock generation circuit configured to provide a scan and asynchronous function, and wherein the inverted clock generation circuit comprises a fifteenth PMOS transistor, a sixteenth PMOS transistor, a seventeenth PMOS transistor, a seventeenth NMOS transistor, an eighteenth NMOS transistor and a nineteenth NMOS transistor.

10. A multibit flip flop comprising:

a first stage one-bit flip flop;

at least one intermediate stage one-bit flip flop; and a last stage one-bit flip flop, wherein the first stage one-bit flip flop, the at least one intermediate stage one-bit flip flop and the last stage one-bit flip flop are configured to share a common clock signal, wherein the first stage one-bit flip flop, the at least one intermediate stage one-bit flip flop and the last stage one-bit flip flop are configured to use an inter cell scan input transfer function in a sequential manner, wherein the first stage one-bit flip flop is configured to provide a scan output signal based on a scan input signal provided at an input port of the first stage one-bit flip flop, wherein the at least one intermediate stage one-bit flip flop is configured to provide a scan intermediate output signal based on the scan output signal, wherein the last stage one-bit flip flop is configured to provide a scan final output signal based on the scan intermediate output signal, and wherein the first stage one-bit flip flop comprises a multiplexer and a master latch, wherein the multiplexer comprises a first pull-up circuit and a first pull-down circuit, wherein the multiplexer is configured to provide an input of a scan enable pin to the first pull-up circuit, generate an output, and provide the output to the master latch of the first stage one-bit flip flop.

11. The multibit flip flop as claimed in claim 10, wherein the first pull-up circuit of the first stage one-bit flip flop comprises a first p-channel metal-oxide semiconductor (PMOS) transistor, a second PMOS transistor, a third PMOS transistor and a fourth PMOS transistor, wherein the first pull-down circuit of the first stage one-bit flip flop comprises a first n-channel metal-oxide semiconductor (NMOS) transistor, a second NMOS transistor, a third NMOS transistor, and a fourth NMOS transistor, wherein the first stage one-bit flip flop comprises:

a first clock gate circuit comprising a fifth NMOS transistor and a fifth PMOS transistor, wherein the fifth NMOS transistor and the fifth PMOS transistor are configured to allow an inverted input signal to be provided to a latch memory at a low state of the common clock signal, wherein a multiplexed signal from the multiplexer is provided to the master latch based on a clock state controlled by the fifth NMOS transistor and the fifth PMOS transistor;

a hybrid master latch comprising the master latch and a clock signal generation circuit, wherein a forward path of the master latch comprises a sixth PMOS transistor and a sixth NMOS transistor, wherein a reverse path of the master latch comprises a seventh PMOS transistor, a seventh NMOS transistor and an eighth NMOS transistor, wherein an output signal of the master latch is propagated based on a state of a second clock gate circuit;

wherein the clock signal generation circuit is configured to generate an nclk signal, wherein the clock signal generation circuit comprises an eighth PMOS transistor, a ninth PMOS transistor, a ninth NMOS transistor and a tenth NMOS transistor, wherein the second clock gate circuit comprises a second pull-up circuit comprising a tenth PMOS transistor and a second pull-down circuit comprising an eleventh NMOS transistor and a twelfth NMOS transistor, wherein the output signal of the master latch is propagated to a slave latch and an output inverter depending on a state of the common clock signal and the nclk signal;

wherein the slave latch is configured to store a signal when the common clock signal is high and keep the output signal from going to a high impedance state when the common clock signal is low, wherein the multibit flip flop further comprises an output stage configured to receive a scan-out signal output from a forward path of the slave latch, wherein the forward path of the slave latch comprises an eleventh PMOS transistor and a thirteenth NMOS transistor, wherein the scan-out signal is output by a CMOS inverter formed by the eleventh PMOS transistor and the thirteenth NMOS transistor, and shares a common polarity with an output pin, wherein a reverse path of the slave latch comprises a twelfth PMOS transistor, a thirteenth PMOS transistor, a fourteenth NMOS transistor and a fifteenth NMOS transistor, wherein the output stage comprises a fourteenth PMOS transistor and a sixteenth NMOS transistor, and wherein a signal of the output stage is stored by the slave latch.

12. The multibit flip flop as claimed in claim 11, wherein the hybrid master latch comprises an inverted clock generation circuit configured to provide a positive-active asynchronous reset function, and wherein the inverted clock generation circuit comprises a fifteenth PMOS transistor, a sixteenth PMOS transistor, a seventeenth NMOS transistor and an eighteenth NMOS transistor.

13. The multibit flip flop as claimed in claim 11, wherein the hybrid master latch comprises an inverted clock generation circuit configured to provide a scan and asynchronous function, and wherein the inverted clock generation circuit comprises a fifteenth PMOS transistor, a sixteenth PMOS transistor, a seventeenth PMOS transistor, a seventeenth NMOS transistor, a eighteenth NMOS transistor and a nineteenth NMOS transistor.

14. The multibit flip flop as claimed in claim 10, wherein the at least one intermediate stage one-bit flip flop comprises:

a multiplexer comprising a first pull-up circuit and a first pull-down circuit, wherein the first pull-up circuit comprises a first p-channel metal-oxide semiconductor (PMOS) transistor, a second PMOS transistor, a third PMOS transistor and a fourth PMOS transistor, and wherein the first pull-down circuit comprises a first n-channel metal-oxide semiconductor (NMOS) transistor, a second NMOS transistor, a third NMOS transistor, and a fourth NMOS transistor, wherein the multiplexer is configured to provide an input of a scan enable pin to the first pull-up circuit, generate an output, and provide the output to a master latch;

a first clock gate circuit comprising a fifth NMOS transistor and a fifth PMOS transistor, wherein the fifth NMOS transistor and the fifth PMOS transistor are configured to allow an inverted input signal to be provided to a latch memory at a low state of the common clock signal, wherein a multiplexed signal from the multiplexer is provided to the master latch based on a clock state controlled by the fifth NMOS transistor and the fifth PMOS transistor;

a hybrid master latch comprising the master latch and a clock signal generation circuit, wherein a forward path of the master latch comprises a sixth PMOS transistor and a sixth NMOS transistor, wherein a reverse path of the master latch comprises a seventh PMOS transistor, a seventh NMOS transistor and an eighth NMOS transistor, wherein an output signal of the master latch is propagated based on a state of a second clock gate circuit;

wherein the clock signal generation circuit is configured to generate an nclk signal, wherein the clock signal generation circuit comprises an eighth PMOS transistor, a ninth PMOS transistor, a ninth NMOS transistor and a tenth NMOS transistor, wherein the second clock gate circuit comprises a second pull-up circuit comprising a tenth PMOS transistor and a second pull-down circuit comprising an eleventh NMOS transistor and a twelfth NMOS transistor, wherein the output signal of the master latch is propagated to a slave latch and an output inverter depending on a state of the common clock signal and the nclk signal;

wherein the slave latch is configured to store a signal when the common clock signal is high and keep the output signal from going to a high impedance state when the common clock signal is low, wherein the multibit flip flop further comprises an output stage configured to receive a scan-out signal output from a forward path of the slave latch, wherein the forward path of the slave latch comprises an eleventh PMOS transistor and a thirteenth NMOS transistor, wherein the scan-out signal is output by a CMOS inverter formed by the eleventh PMOS transistor and the thirteenth NMOS transistor, and shares a common polarity with an output pin, wherein a reverse path of the slave latch comprises a twelfth PMOS transistor, a thirteenth PMOS transistor, a fourteenth NMOS transistor and a fifteenth NMOS transistor, wherein the output stage comprises a fourteenth PMOS transistor and a sixteenth NMOS transistor, and wherein a signal of the output stage is stored.

15. The multibit flip flop as claimed in claim 14, wherein the hybrid master latch comprises an inverted clock generation circuit configured to provide a positive-active asynchronous reset function, and wherein the inverted clock generation circuit comprises a fifteenth PMOS transistor, a sixteenth PMOS transistor, a seventeenth NMOS transistor and an eighteenth NMOS transistor.

16. The multibit flip flop as claimed in claim 14, wherein the hybrid master latch comprises an inverted clock generation circuit configured to provide a scan and asynchronous function, and wherein the inverted clock generation circuit comprises a fifteenth PMOS transistor, a sixteenth PMOS transistor, a seventeenth PMOS transistor, a seventeenth NMOS transistor, an eighteenth NMOS transistor and a nineteenth NMOS transistor.

17. The multibit flip flop as claimed in claim 10, wherein the last stage one-bit flip flop comprises:

a multiplexer comprising a first pull-up circuit and a first pull-down circuit, wherein the first pull-up circuit comprises a first p-channel metal-oxide semiconductor (PMOS) transistor, a second PMOS transistor, a third PMOS transistor and a fourth PMOS transistor, and wherein the first pull-down circuit comprises a first n-channel metal-oxide semiconductor (NMOS) transistor, a second NMOS transistor, a third NMOS transistor, and a fourth NMOS transistor, wherein the multiplexer is configured to provide an input of a scan enable pin to the first pull-up circuit, generate an output and provide the output to a master latch;

a first clock gate circuit comprising a fifth NMOS transistor and a fifth PMOS transistor, wherein the fifth NMOS transistor and the fifth PMOS transistor are configured to allow an inverted input signal to be provided to a latch memory at a low state of the common clock signal, wherein a multiplexed signal from the multiplexer is provided to the master latch based on a clock state controlled by the fifth NMOS transistor and the fifth PMOS transistor;

a hybrid master latch comprising the master latch and a
clock signal generation circuit, wherein a forward path
of the master latch comprises a sixth PMOS transistor
and a sixth NMOS transistor, wherein a reverse path of
the master latch comprises a seventh PMOS transistor,
a seventh NMOS transistor and an eighth NMOS
transistor, wherein an output signal of the master latch
is propagated based on a state of a second clock gate
circuit;

wherein the clock signal generation circuit is configured
to generate an nclk signal, wherein the clock signal generation circuit comprises an
eighth PMOS transistor, a ninth PMOS transistor, a
ninth NMOS transistor and a tenth NMOS transistor, wherein the second clock gate circuit comprises a second
pull-up circuit comprising a tenth PMOS transistor and
a second pull-down circuit comprising an eleventh
NMOS transistor and a twelfth NMOS transistor,
wherein the output signal of the master latch is propa-
gated to a slave latch and an output inverter depending
on a state of the common clock signal and the nclk
signal, wherein the slave latch is configured to store a signal
when the common clock signal is high and keep the
output signal from going to a high impedance state
when the common clock signal is low, wherein a scan-out signal output of a CMOS inverter
formed by an eleventh PMOS transistor and a thirteenth
NMOS transistor, and an output pin have a common
polarity, wherein a reverse path of the slave latch comprises a
twelfth PMOS transistor, a thirteenth PMOS transistor,
a fourteenth NMOS transistor and a fifteenth NMOS
transistor, wherein the multibit flip flop further comprises an output
stage comprising a fourteenth PMOS transistor and a
sixteenth NMOS transistor, and wherein a signal of the output stage is stored by the slave
latch.

18. The multibit flip flop as claimed in claim 17, wherein
the hybrid master latch comprises an inverted clock genera-
tion circuit configured to provide a positive-active asynchro-
nous reset function, and wherein the inverted clock generation circuit comprises a
fifteenth PMOS transistor, a sixteenth PMOS transistor,
a seventeenth NMOS transistor and an eighteenth
NMOS transistor.

19. The multibit flip flop as claimed in claim 17, wherein
the hybrid master latch comprises an inverted clock genera-
tion circuit configured to provide a scan and asynchronous
function, and wherein the inverted clock generation circuit comprises a
fifteenth PMOS transistor, a sixteenth PMOS transistor,
a seventeenth PMOS transistor, a seventeenth NMOS
transistor, an eighteenth NMOS transistor and a nine-
teenth NMOS transistor.

20. A method of a multibit flip flop, comprising:
providing a first stage one-bit flip flop and a second stage
one-bit flip flop, wherein the first stage one-bit flip flop
and the second stage one-bit flip flop share a common
clock signal, and wherein the first stage one-bit flip flop
and the second stage one-bit flip flop use an inter cell
scan input transfer function in a sequential manner,
wherein the first stage one-bit flip flop includes a
multiplexer and a master latch, and wherein the mul-
tiplexer includes a first pull-up circuit and a first
pull-down circuit;

generating an output of the multiplexer as a scan input
signal and providing the scan input signal to an input
port of the first stage one-bit flip flop;

generating a scan output signal based on the scan input
signal provided to the input port of the first stage
one-bit flip flop; and generating a scan final output signal based on the scan
output signal.

* * * * *